United States Patent [19]

Asano et al.

[11] Patent Number: 4,597,062
[45] Date of Patent: Jun. 24, 1986

[54] NON-VOLATILE SEMICONDUCTOR MEMORY SYSTEM

[75] Inventors: Masamichi Asano, Tokyo; Hiroshi Iwahashi, Yokohama, both of Japan

[73] Assignee: Tokyo Shibaura Denki Kabushiki Kaisha, Japan

[21] Appl. No.: 630,863

[22] Filed: Jul. 16, 1984

Related U.S. Application Data

[62] Division of Ser. No. 353,515, Mar. 1, 1982, Pat. No. 4,506,350.

[30] Foreign Application Priority Data

Mar. 3, 1981 [JP] Japan .................................. 56-30210
Apr. 17, 1981 [JP] Japan .................................. 56-57900
Jun. 3, 1981 [JP] Japan .................................. 56-85466

[51] Int. Cl.$^4$ ............................................. G11C 7/00
[52] U.S. Cl. ..................................... 365/201; 365/182
[58] Field of Search ............... 365/182, 200, 201, 230; 371/21

[56] References Cited

U.S. PATENT DOCUMENTS 4,342,103   7/1982   Higuchi et al. ..................... 365/230

Primary Examiner—Joseph A. Popek
Attorney, Agent, or Firm—Finnegan, Henderson, Farabow, Garrett & Dunner

[57] ABSTRACT

A non-volatile semiconductor memory system includes a memory cell array having floating gate type MOS transistors, and a boosting circuit for boosting a write voltage applied to the memory system. A distributing circuit is further contained for selectively distributing a boosted voltage from the boosting circuit to at least a part of the memory system, for example, row lines in response to a control signal.

7 Claims, 29 Drawing Figures

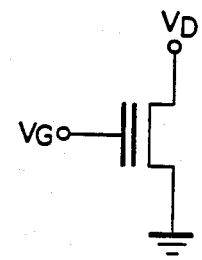
F I G. 2A
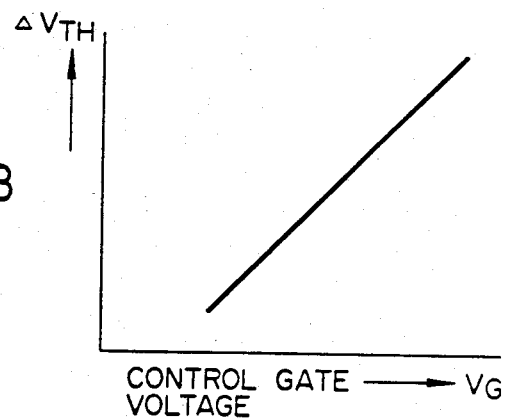
F I G. 2B
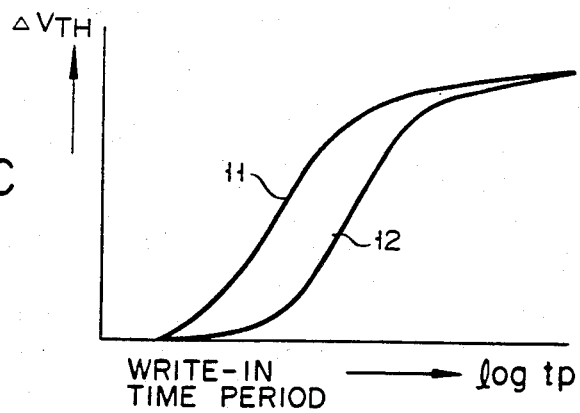
F I G. 2C

F I G. 4
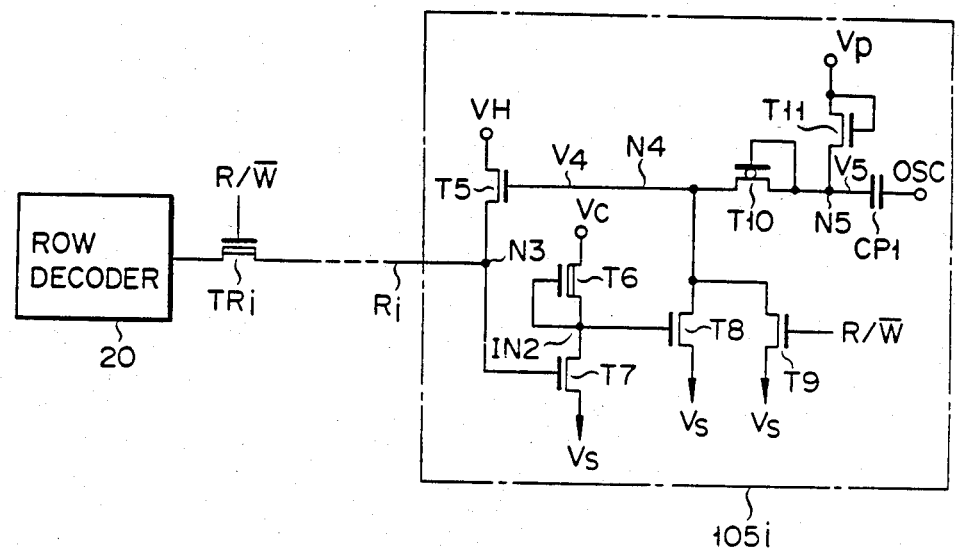
F I G. 5
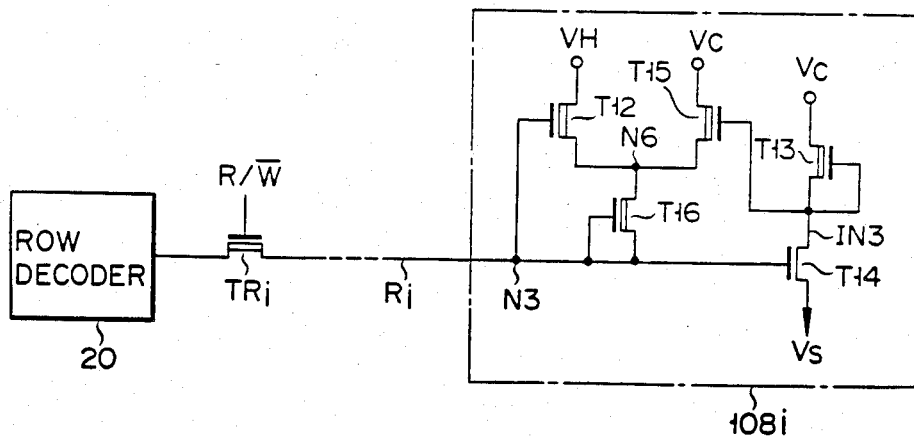

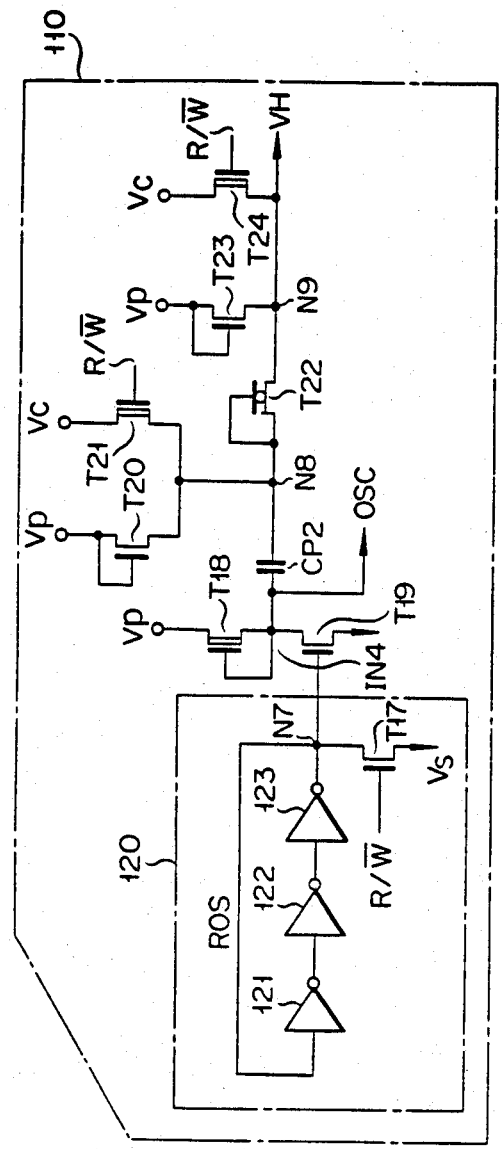
F I G. 6
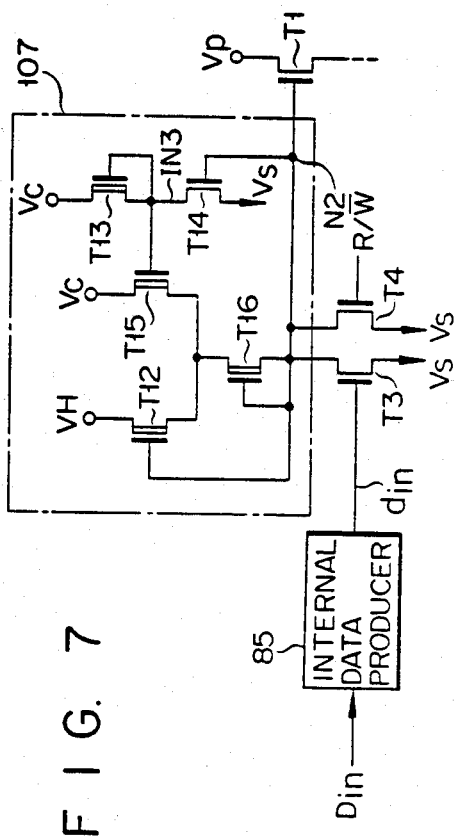
F I G. 7

F I G. 8
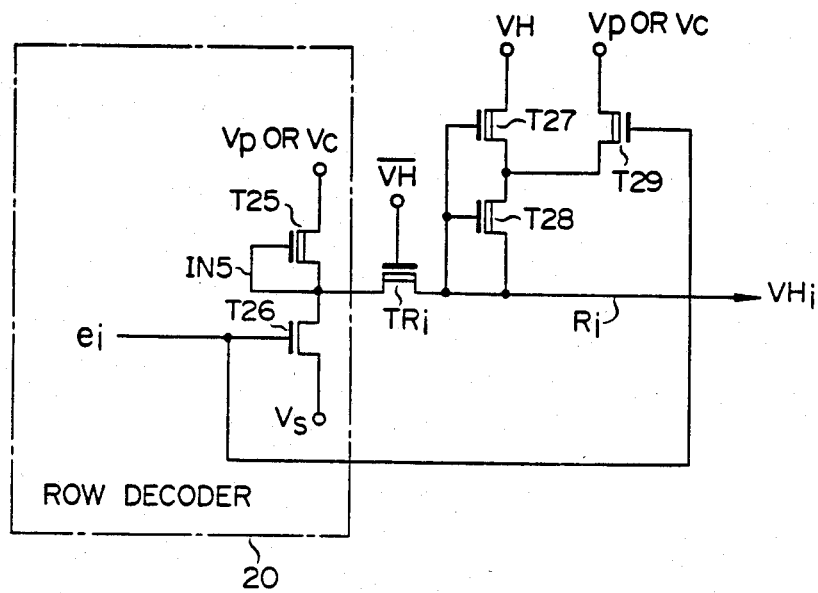
F I G. 11
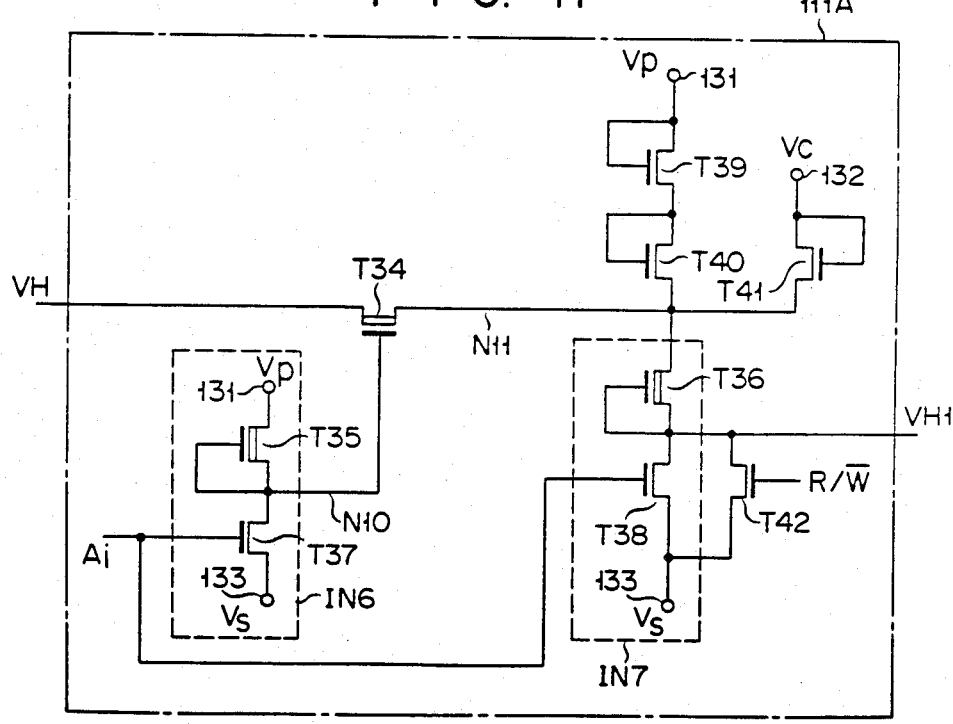

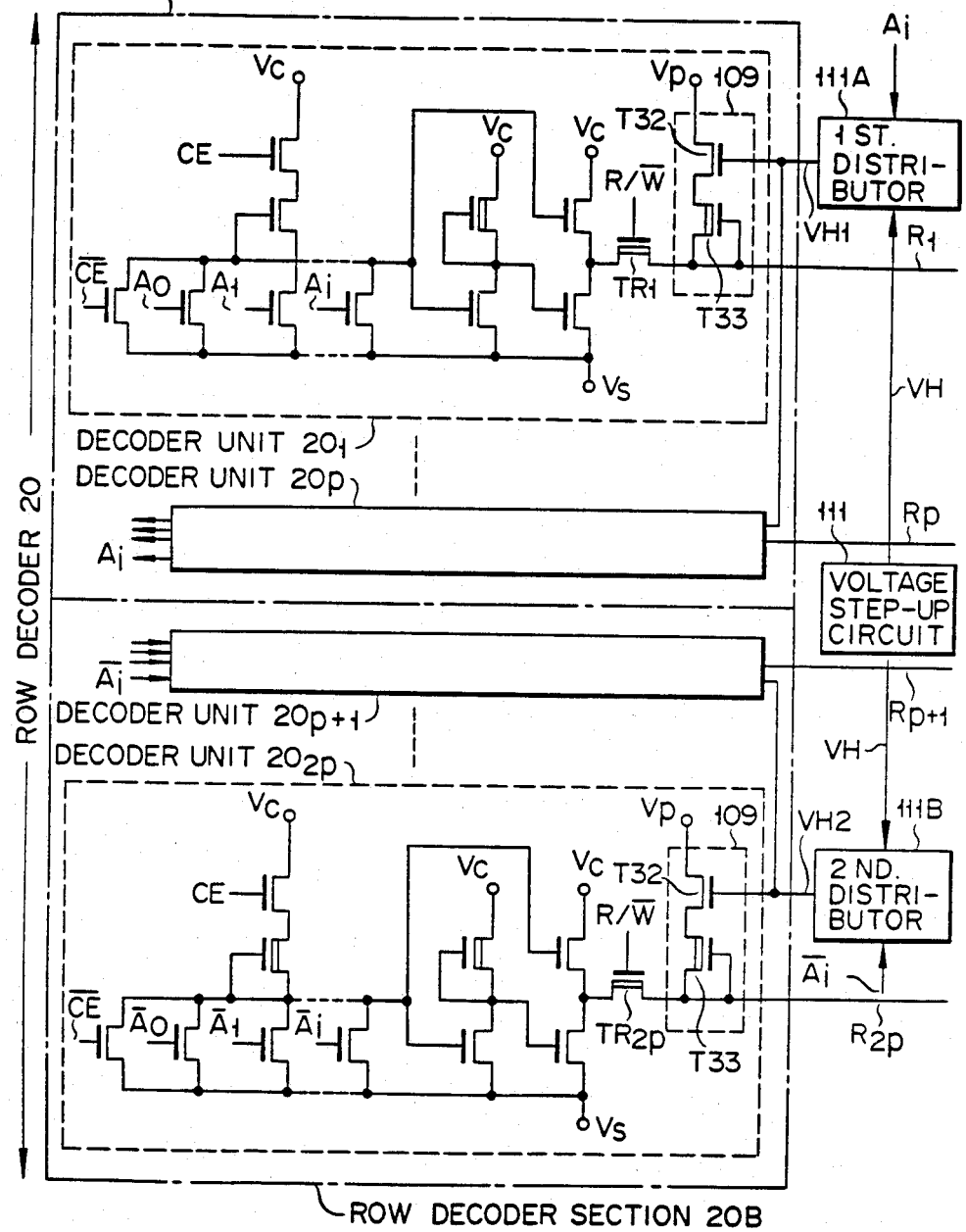
F I G. 10

OUTPUT WAVEFORM
OF OSCILLATOR 138

POTENTIAL
ON NODE N13

POTENTIAL
ON NODE N10

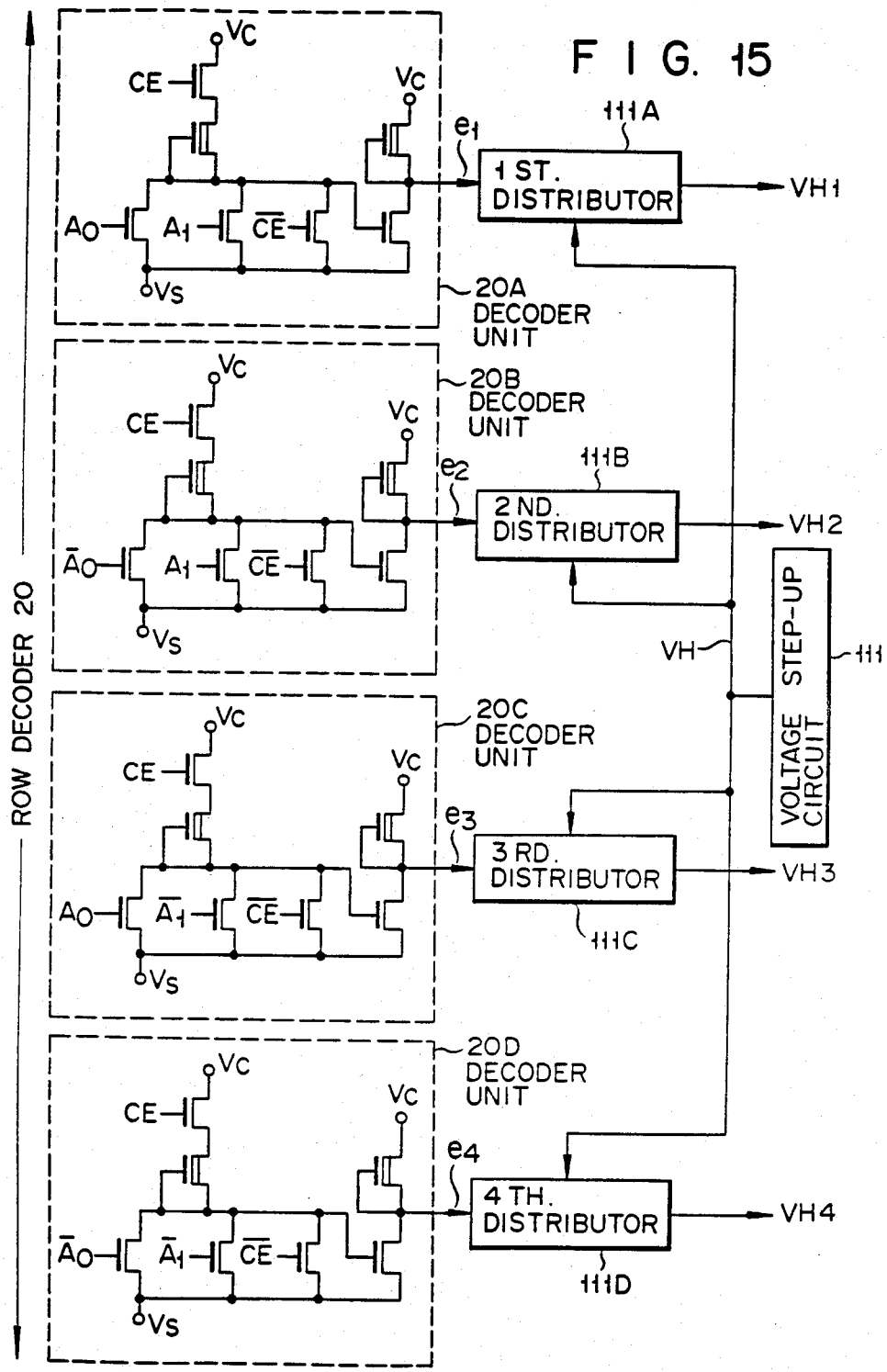
F I G. 15

F I G. 17B
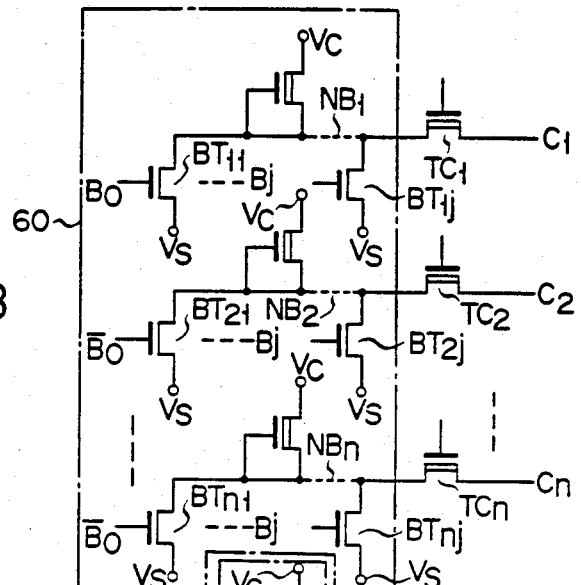
F I G. 17A
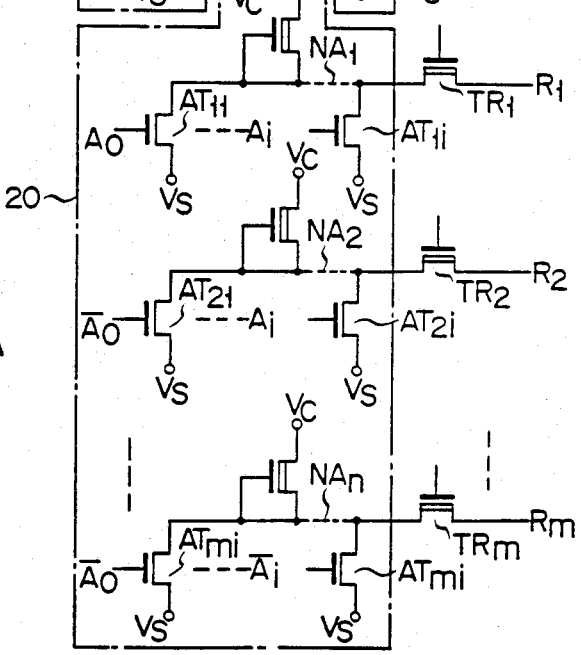

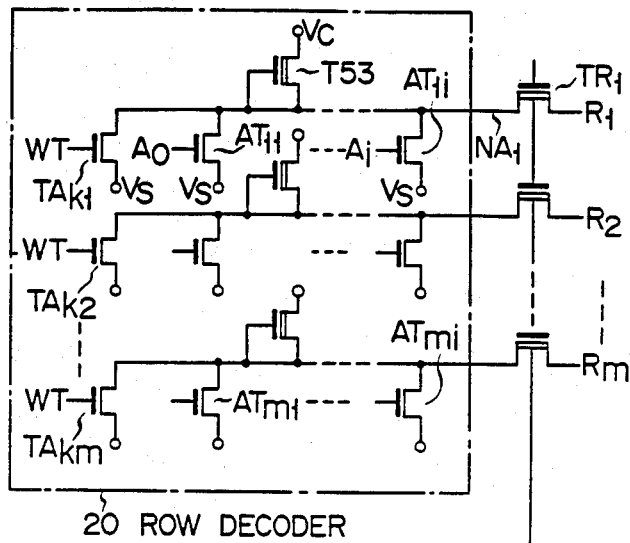
F I G. 18A
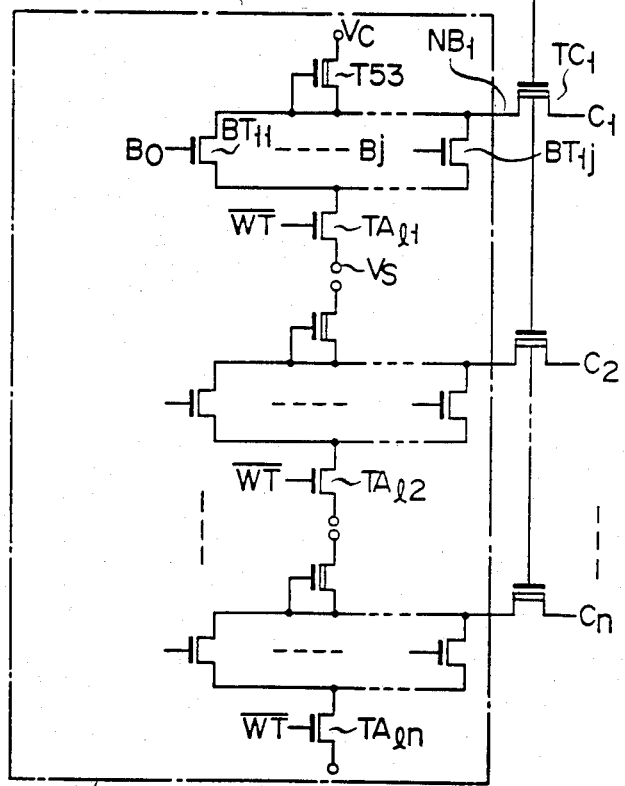
F I G. 18B

F I G. 19A
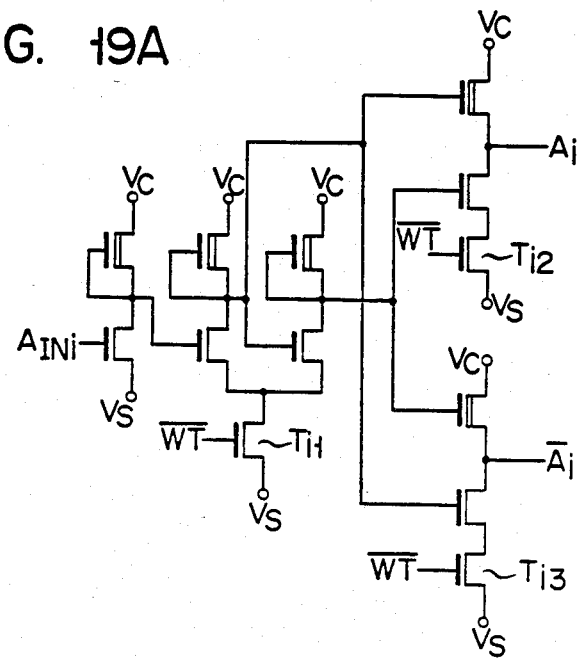
F I G. 19B
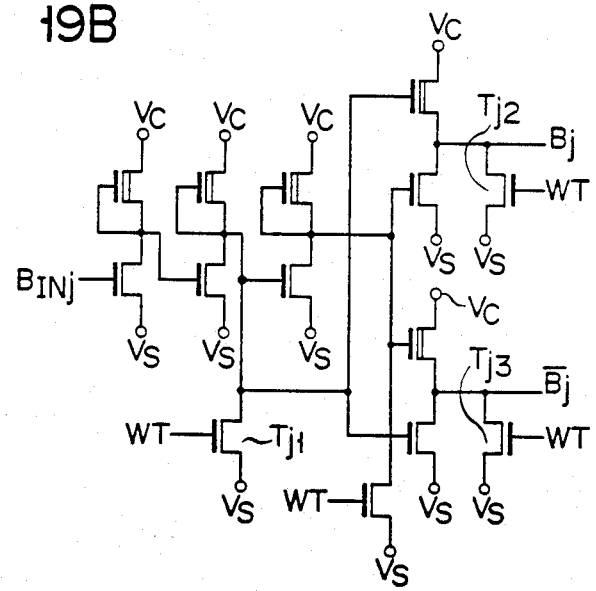

NON-VOLATILE SEMICONDUCTOR MEMORY SYSTEM

This is a division of application Ser. No. 06/353,515, filed Mar. 1, 1982, now U.S. Pat. No. 4,506,350.

BACKGROUND OF THE INVENTION

The present invention generally relates to a memory system using non-volatile semiconductor memory cells, and more particularly to a non-volatile semiconductor memory system improved in a characteristic of writing data into memory cells and reduced in power consumption at the time of data write.

The non-volatile semiconductor memory system using non-volatile memory cells, for example, floating gate type MOS transistors, is known as an EPROM (Erasable Programmable Read Only Memory). In storing data into the floating gate type memory cells, a high voltage is applied to the control gate provided above the floating gate through an insulating layer and the drain of the memory cell while holding a reference voltage Vs having about ground potential applied to the source, thereby causing the impact ionization to take place between the drain and the source. Of electron-hole pairs produced by the impact ionization, electrons are captured by the floating gate to change the threshold voltage of the memory cell. According to the change of the threshold voltage, data is stored. In memory cells of this type, the substantial gate potential is changed depending on a quantity of the electrons captured by the gate. Accordingly, the data stored in the memory cell can be detected (read out) through a change in the channel current of the MOS transistor. Practically, in writing data into the memory cell, a high voltage of 20 to 25 V is usually applied to the control gate above the floating gate and the drain. In reading out data, some 5 V is applied to the control gate usually.

In the prior EPROM, the write voltage applied to the control gate is fixed at 25 V. Accordingly, 50 ms is usually taken for writing data into one memory cell. Accordingly, when data is written into all the memory cells in a 4 K words×8 bits, for example, about three minutes must be taken. For reducing the write time, a gate voltage applied to the control gate of each memory cell and/or a drain voltage applied to the drain must be set to be higher than those of the prior one. Practically, to realize this, a power source voltage externally supplied to the memory system, e.g. a write power source voltage, is boosted by a voltage boosting circuit. Then, the boosted voltage may be applied to the control gate of the memory cell or the boosted voltage is applied to the control gate and at the same time a voltage which is higher than that of the prior art one and obtained using the boosted voltage may be applied to the drain of the memory cell. Generally, the boosting circuit is constructed such that it is contained in the integrated circuit of the memory system, and a given power source voltage for feed to the memory system, e.g. a write voltage, is boosted up to a given voltage by using a capacitance coupling. With this circuit arrangement, the output current from the boosting circuit is limited to a great extent. In recent memory systems in which transistors are extremely minute, the memory capacity is much larger, and the row and column lines are greater in number, the current consumed in the decoder sections is greatly increased. In order to reduce the current consumption in the decoder sections when data is written into the memory cell array, it is accordingly necessary to apply the boosted voltage to only the selected column or row line. Nevertheless, the prior non-volatile semiconductor memory system is not so arranged that the output current of the boosting circuit is decreased by selectively applying the boosted voltage to a peripheral circuit of the memory cell array, e.g. the write circuit.

For a better understanding of the present invention, an outline of a prior non-volatile semiconductor memory system will be described referring to FIG. 1. In the Figure, $R_1$ to $R_m$ designate row lines and $D_1$ to $D_n$ column lines. Memory cells $TM_{11}$ to $TM_{mn}$, each made up of a floating gate type MOS transistor are located at cross points of the row and column lines and arranged in a matrix fashion. The control gates of the memory cells $TM_{11}$ to $TM_{mn}$ are connected to the corresponding row lines $R_1$ to $R_m$, respectively. Similarly, the drains are connected to the corresponding column lines $D_1$ to $D_n$, respectively. A reference voltage $V_S$, e.g. an earth potential, is applied to the sources of all the memory cells $TM_{11}$ to $TM_{mn}$. The row lines $R_1$ to Rm, the column lines $D_1$ to Dn, and the memory cells $TM_{11}$ to TMmn cooperate to form a memory cell array 10.

The row lines $R_1$ to $R_m$ are connected to a row decoder 20, through MOS transistors $TR_1$ to $TR_m$ of the depletion type (D type). A read/write control signal R/$\overline{W}$ is applied to the gates of the MOS transistors $TR_1$ to $TR_m$. The row decoder 20 responds to address signals to select one row line and to produce a high level signal at the output terminal corresponding to the selected row line.

The column lines $D_1$ to $D_n$ are connected to a signal detection node N1, through corresponding MOS transistors of those transistors $TD_1$ to $TD_n$ provided in the column line selection circuit 30 for selecting a column line. The signal at the node N1 is sensed by a sense amplifier 40 and the sensed signal is produced through an output circuit 50 to the outside of the memory system. Column selection lines $C_1$ to $C_n$ are connected to the gates of the MOS transistors $TD_1$ to $TD_n$, respectively. The column selection lines $C_1$ to $C_n$ are connected to a column decoder 60, through the MOS transistors $TC_1$ to $TC_n$ correspondingly arranged. The column decoder 60 responds to selection address signals supplied to the column decoder itself to select one of the column select lines and provides a high level signal at the output terminal connected to the selected column selection line.

The other terminals of the row lines $R_1$ to $R_m$ and the column lines $C_1$ to $C_n$ are respectively connected to the D type MOS transistors $WR_1$ to $WR_m$ and $WC_1$ to $WC_n$ in a corresponding manner. The drains of those D type MOS transistors are connected to a terminal for applying the write voltage $V_p$. The sources and gates of those D type MOS transistors are connected to the corresponding row and column lines, respectively. The MOS transistors $WR_1$ to $WR_m$ and $WC_1$ to $WC_n$ are all contained in a write transistor circuit 70. A write transistor T1 of the E type (enhancement type) is connected between the signal sense node N1 and the write voltage $V_p$ applying terminal. A signal on the output node N2 of the write-in data control circuit 80 is supplied to the gate of the write MOS transistor T1. The write-in data control circuit 80 is comprised of an internal data producer 85 which receives the external input data $D_{in}$ to produce internal data $d_{in}$ corresponding to the external input data $D_{in}$, an inverter IN1 inserted between the voltage $V_p$ applying terminal and the reference voltage $V_S$ (ground potential), and an E type MOS transistor T4 for receiving at the gate a read/write signal R/$\overline{W}$ by being inserted between the output node N2 and the reference voltage $V_S$ (ground potential). The inverter IN1 is comprised of a D type MOS transistor T2 connected at the source-drain path between a voltage $V_p$ applying terminal and the node N2, and at the gate to the node N2, and an E type MOS transistor T3 which is connected at the source-drain path between the node N2 and the reference voltage $V_S$ and receives the internal data $d_{in}$ at the gate.

The operation of the memory system shown in FIG. 1 will be given. For reading out the data from the memory cell array 10, the read/write signal R/$\overline{W}$ is high ("1") in level and the write voltage $V_p$ is 5 V. For this, the MOS transistors $TC_1$ to $TC_n$, and $TR_1$ to $TR_m$ are turned on, the MOS transistor T4 is also turned on, and the MOS transistor T1 is turned off. The conductance $g_m$ of each of the MOS transistors $WC_1$ to $WC_n$ and $WR_1$ to $WR_m$ in the write transistor circuit 70 is set at an extremely small value. Therefore, of the row lines $R_1$ to $R_m$ and column select lines $C_1$ to $C_n$, only those selected by the row decoder 20 and the column decoder 60 are set at high level, while those not selected are set at low level. As a result, a memory cell located at the cross point of the selected row and column lines is driven. If no data has been written into the selected memory cell, the memory cell is turned on because at this time the threshold voltage of the selected memory cell having no data written is low. Upon turning on of the memory cell, current flows through the source-drain path, so that the signal sensing node N1 becomes low in level. On the other hand, if data has been written into the selected memory cell, the memory cell is turned off because at this time the threshold voltage of the selected memory cell having data written is high, and the node N1 becomes high in level. The high level signal at the node N1 is led out to the exterior through the sense amplifier 40 and the output circuit 50.

In a write mode, the read/write signal R/$\overline{W}$ is low and the write voltage $V_p$ is 25 V. Assume now that the row line $R_1$ is selected by the row decoder 20 and the column select line $C_1$ is selected by the column decoder 60. Then, the MOS transistors $TR_1$ and $TC_1$ are turned off. Under this condition, the row line $R_1$ is charged up to 25 V (equal to the write voltage $V_p$) through the MOS transistor $WR_1$, and the column selection line $C_1$ is charged up to 25 V through the MOS transistor $WC_1$. The row and column lines not selected are low in level, i.e. at ground potential, since the MOS transistors $TR_2$ to $TR_m$ and $TC_2$ to $TC_n$ are turned on because the outputs of the row and column decoders corresponding to these row and column selection lines not selected. At this time, if the external input data $D_{in}$ is low, the internal data $d_{in}$ is also low and 25 V ($V_p$) appears at the node N2. For this reason, the MOS transistor T1 is turned on and the node N1 is charged up to about 22 V given by $V_p$-$V_{TH}$ where $V_{TH}$ is a threshold voltage of the MOS transistor T1. Accordingly, 25 V ($V_p$) is applied to the control gate of the memory cell $TM_{11}$ selected by the row line $R_1$ and the column line $D_1$. About 22 V given by (25-$V_{TH(T1)}$) V or (25-$V_{TH(TD1)}$) V is applied to the drain of the memory cell $TM_{11}$, where $V_{TH(T1)}$ is a threshold voltage of the MOS transistor T1, and $V_{TH(TD1)}$ is a threshold voltage of the MOS transistor $TD_1$. As a result, the impact ionization takes place in the memory cell $TM_{11}$ and data is written therein. If, at this time, external input data $D_{in}$ is high in level, the MOS transistor T1 is turned off, so that the 22 V is not applied to the drain of the memory cell $TM_{11}$. Therefore, no data is loaded into the memory cell $TM_{11}$. The memory cell, into which data is once loaded, keeps the data in a non-volatile manner, so long as the data is not erased.

As already described, in the memory system in FIG. 1, the write voltage $V_p$ is fixed at 25 V. Therefore, a long time is needed in order to write the data into all the memory cells in the memory cell array. To solve this problem, a higher voltage than that of the prior art must be applied to the control gates of the memory cells or to both the control gates and the drains. The reason for this will be given referring to FIGS. 2A to 2C. FIG. 2A illustrates a symbolic representation of the floating gate type MOS transistor. $V_D$ designates a drain voltage and $V_G$ a voltage applied to the control gate. FIG. 2b shows a relationship between a control gate voltage $V_G$ and a change $\Delta V_{TH}$ of the threshold voltage of the memory cell when the data write is performed at fixed values of the drain voltage $V_D$ and the write time tp. FIG. 2C illustrates a relationship between logarithmic values of the write time tp and a change $\Delta V_{TH}$ of the threshold voltage when the data write is performed with a parameter of the drain voltage $V_D$, while fixing the control gate voltage $V_G$. In the figure, a curve 11 represents the relationship when the voltage $V_D$ is large and the curve 12 represents the same when the $V_D$ is small. As shown in FIGS. 2B and 2C, the higher the control gate voltage $V_G$, the shorter the write time tp. When the write time tp is relatively long, a change $\Delta V_{TH}$ of the threshold voltage is independent of the drain voltage $V_D$. When the time tp is relatively short, a short time is needed for obtaining a given amount of the change $\Delta V_{TH}$.

However, when the boosted voltage is applied to the row line, a special boosted voltage applying means is necessary for decreasing the output current of the boosting circuit.

SUMMARY OF THE INVENTION

Accordingly, an object of the present invention is to provide a non-volatile semiconductor memory system which can reduce the write time by applying a higher voltage than that of the prior memory system to given portions of the non-volatile memory cell, and can decrease the output current from a voltage boosting circuit when the data is written into the memory cell array by selectively applying a boosted voltage from the boosting circuit to at least one of peripheral circuits of a memory cell array.

According to one aspect of the present invention, a non-volatile semiconductor memory system with a memory cell array having non-volatile semiconductor memory cells for storing data through the charges injected into a gate insulating film arranged in a matrix fashion has boosting means for a voltage of a given power source for applying a given voltage to the memory system; and boosted voltage applying means for selectively applying the boosted voltage to at least one portion of the memory system in response to a control signal.

According to another aspect of the present invention, a non-volatile semiconductor memory system with a memory cell array having non-volatile semiconductor memory cells for storing data through the charges injected into a gate insulating film arranged in a matrix fashion has boosting means for a voltage of a given power source for applying a given voltage to the memory system; and a plurality of boosted voltage distributing means for selectively dividing and applying the boosted voltage from the boosting means to at least one peripheral circuit of the memory cell array.

BRIEF DESCRIPTION OF THE DRAWINGS

FIGS. 2A to 2C illustrate a symbolic representation of a floating gate type MOS transistor used in FIG. 1 and characteristics of the same transistor;

FIG. 4 shows a circuit diagram of a boosted voltage distributing circuit connected to row lines in the circuit shown in FIG. 3;

FIG. 5 is a circuit diagram of another boosted voltage distributing circuit connected to the row lines;

FIG. 6 is a circuit diagram of an embodiment of the boosting circuit shown in FIG. 3;

FIG. 7 is a circuit diagram of an embodiment of a write data control circuit in FIG. 3;

FIG. 8 is a circuit diagram of another embodiment of the boosted voltage distributing circuit connected to the row line in the circuit shown in FIG. 3;

FIG. 10 is a circuit diagram of the circuit for applying the boosted voltage to the write circuit of the non-volatile semiconductor memory system according to the present invention, through a plurality of the boosted voltage applying circuits;

FIG. 11 is a circuit diagram of an embodiment of the boosted voltage distributing circuit shown in FIG. 10;

FIG. 15 is a circuit diagram of an embodiment for applying the boosted voltage through a plurality of boosted voltage distributing circuits to a write circuit of a non-volatile semiconductor memory system according to the present invention;

FIGS. 17A and 17B show circuit diagrams of a row decoder and a column decoder of the prior EPROM shown in FIG. 1;

FIGS. 18A and 18B show circuit diagrams of modifications of these decoders shown in FIGS. 17A and 17B; and FIGS. 19A and 19B are circuit diagrams of address buffers according to the present invention.

DETAILED DESCRIPTION OF THE PREFERRED EMBODIMENTS

Figure 1:
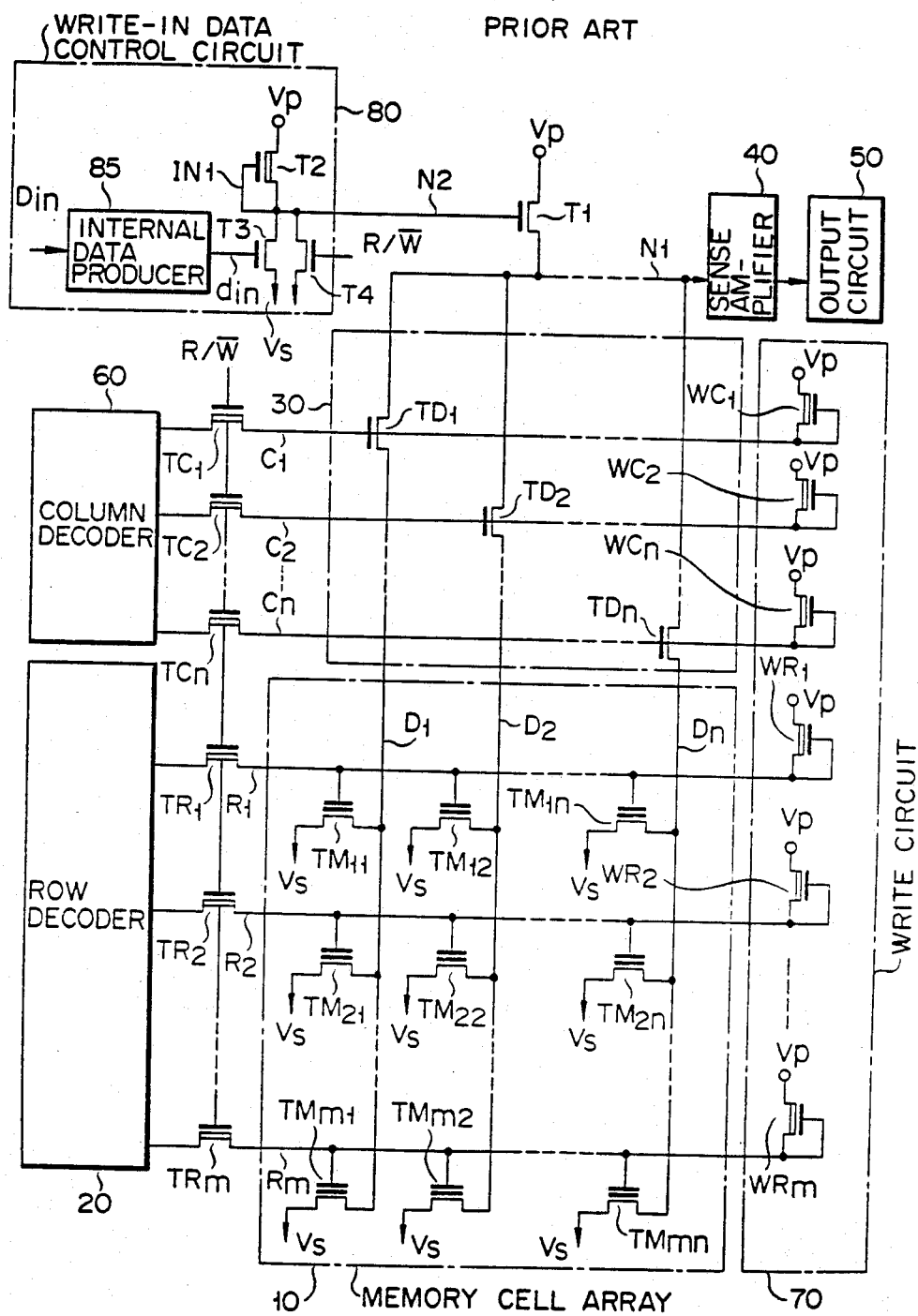
FIG. 1 shows a block diagram of a prior erasable programmable read only memory (EPROM) system.
Figure 3:
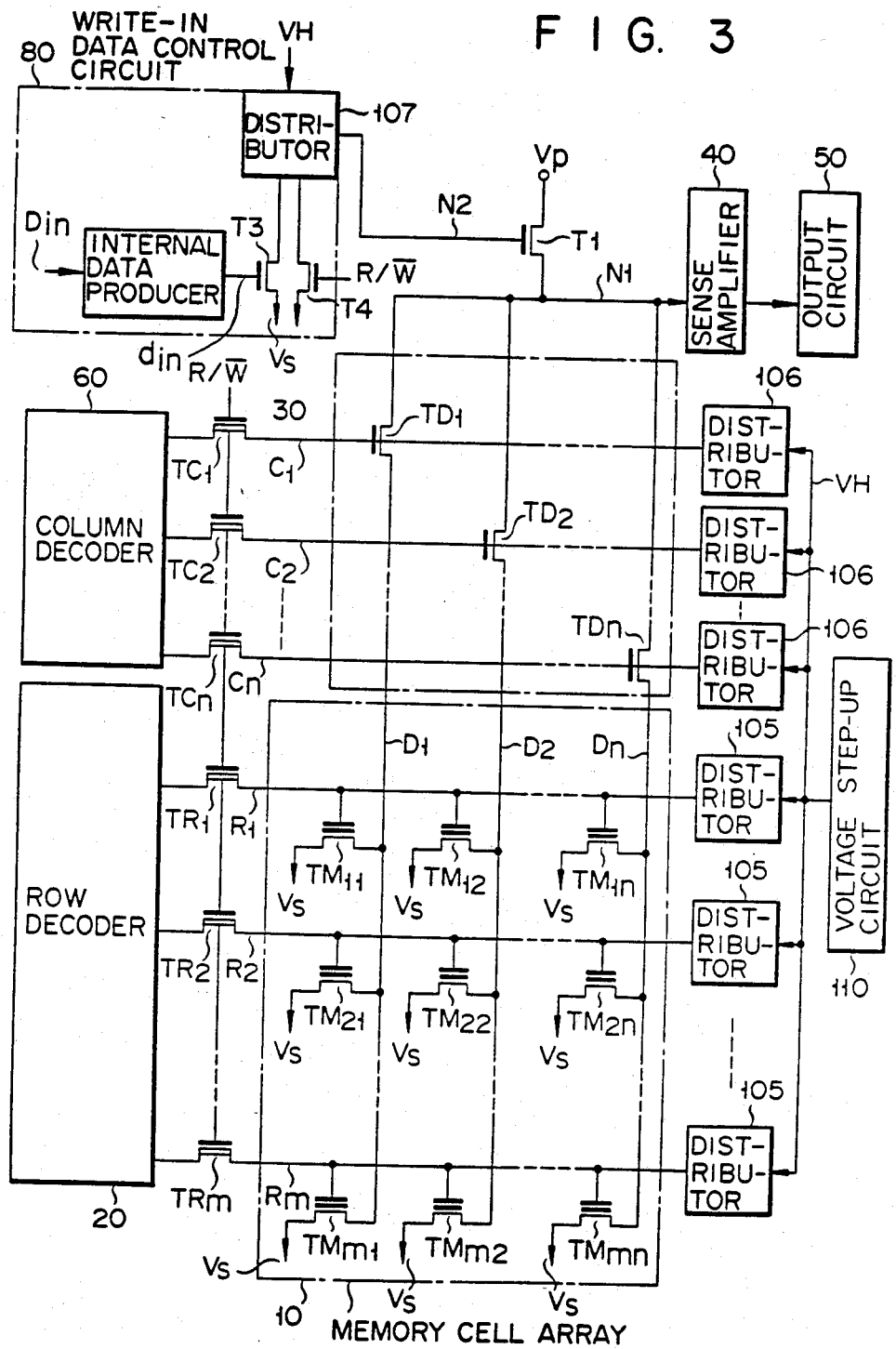
FIG. 3 is a block diagram of an embodiment of an EPROM system according to the present invention.

An embodiment of a non-volatile semiconductor memory system will now be described. In FIG. 3, row lines $R_1$ to $R_m$ are connected at their ends to a boosted voltage distributing circuit 105 (corresponding to the write circuit of the prior art). Column select lines $C_1$ to $C_n$ are connected at ends to another boosted voltage distributing circuit 106 (corresponding to the write circuit of the prior art). A boosted voltage VH boosted by a boosting circuit 110 is applied to these distributing circuits 105 and 106. A boosted voltage distributing circuit 107, in place of the D type MOS transistor T2 in the write control circuit 80 in FIG. 1, is further provided, to which a boosted voltage VH is applied from the boosting circuit 110. In FIG. 3, like reference symbols are used to designate like portions in FIG. 1, for simplicity of explanation. The details of the boosting circuit 110 will be described later referring to FIG. 6. In the present explanation, it will be treated as a mere circuit to provide the boosted voltage VH. These distributing circuits 105 and 106, having the same constructions, each serve to distribute the boosted voltage under control of a control signal. Therefore, only one distributing circuit 105$i$ as a typical example will be described referring to FIG. 4. Incidentally, "i" of 105$i$ represents the i-th distributing circuit of those circuits, which is connected to the i-th row line. $TR_i$ designates a D type MOS transistor in which the source-drain path is connected at one end to the output terminal of the row decoder 20, and at the end to the row line $R_i$, and its gate receives a read/write control signal R/$\overline{W}$. Here, "i" is given by $1 < i < m$. The other end of the row line $R_i$ is connected to a node N3 of a distributing circuit 105i. The distributing circuit 105i is comprised of an E type MOS transistor T5 inserted between a terminal for applying a boosted voltage VH from the boosting circuit 110 and a node N3, an inverter IN2, an E type MOS transistor T8 in which the source-drain path is connected at one end to the node N4 connected to the gate of the MOS transistor T5, and coupled at the other end to the earth potential $V_S$, the gate of the MOS transistor T8 is connected to the output from the inverter IN2, an E type MOS transistor T9 connected in parallel with the MOS transistor T8 and coupled at the gate with the read/write control signal R/$\overline{W}$, a MOS transistor T10 in which the source-drain path is inserted between nodes N4 and N5, the gate is connected to the node N5, and the threshold voltage of the MOS transistor T10 is about 0 V (referred to as N type), an E type MOS transistor T11 in which the source-drain path is inserted between the node N5 and the write voltage $V_p$ applying terminal, and coupled at the gate with the write voltage $V_p$, and a capacitor CP1 inserted between the node N5 and a terminal for applying a pulse signal OSC to be describe later. The inverter IN2 is comprised of a D type MOS transistor T6 in which the source-drain path is inserted between a terminal for applying a 5 V voltage $V_c$ and the output terminal of the inverter, and an E type MOS transistor of which the source-drain path is inserted between the output terminal of the inverter IN2 and the ground potential $V_S$, and the gate is connected to the node N3.

The operation of the write circuit shown (boosted voltage distributing circuit) in FIG. 4 will be described. When the write voltage $V_p$ is 25 V in a write mode, the boosting circuit 110 produces a boosted voltage VH of about 30 V. This will be described in detail referring to FIG. 6. At this time, if the row decoder 20 select the row line $R_i$ and the row line $R_i$, i.e. the node N3, is high in level, the output from the inverter IN2 is low in level. Accordingly, the MOS transistor T8 is cut off. In a write mode, the read/write control signal R/$\overline{W}$ is low in level, so that the MOS transistor T9 is also cut off. Accordingly, the node N4 is charged by the write voltage $V_p$ through the MOS transistors T11 and T10. The pulse signal OSC applied to one end of the capacitor CP1 swings between the about the earth potential $V_S$ and the write voltage $V_p$ (this will be discussed in more detail referring to FIG. 6). Therefore, the voltage $V_5$ at the node N5 has a peak which is theoritically expressed by an equation (1)

$$V_5 = \{V_p - V_{TH(T11)}\} + V_p' \quad (1)$$

where $V_{TH(T11)}$ is a threshold voltage of the MOS transistor T11, and $V_p'$ is an amplitude of the pulse signal OSC. The voltage $V_4$ at the node N4 is lower than the voltage at the node N5 by the threshold voltage $V_{TH(T10)}$ of the MOS transistor T10. Therefore, the following equation holds $$V_4 = \{V_p - V_{TH(T11)}\} + V_p' - V_{TH(T10)} \quad (2)$$

Since the node N5 in fact contains a stray capacitance, the voltage $V_4$ slightly drops through the voltage division made by the capacitance of the capacitor CP1 and the stray capacitor. Nevetheless, about 35 V is obtained as the voltage $V_4$ at the node N4. As a result, the MOS transistor T5 operates in a triode region. Therefore, the boosted voltage VH is applied to the node N3, i.e. the row line $R_i$, as it is. In a memory cell of which the control gate is connected to the row line $R_i$, for example, the floating gate type memory cell shown in FIG. 3, the control gate voltage is increased by about 5 V, compared to that of the prior art. Therefore, as seen from the characteristic shown in FIG. 2B, data is written into the memory cells for a shorter time, compared with the prior art memory system. Further, the boosted voltage VH is selectively applied to the row line $R_i$ only when the distributing circuit 105i is controlled by the signal on the row line $R_i$. Therefore, the output current from the boosting circuit 110 may be decreased. Since the boosting circuit 110 is generally provided in an integrated circuit of the memory system it is very important to decrease the output current of the boosting circuit.

An embodiment of the boosting circuit 110 is illustrated in FIG. 6. The boosting circuit 110 produces the boosted voltage VH and the pulse signal OSC as already described referring to FIG. 4. In FIG. 6, a reference numeral 120 designates an oscillator circuit comprising a ring oscillator ROS including three stages of inverters 121, 122 and 123 with a power source of a 5 V voltage $V_c$, and an oscillation control E type MOS transistor T17 in which the source-drain path is inserted between the output node N7 of the ring oscillator ROS and the ground potential $V_S$, and the gate is coupled with the read/write control signal R/$\overline{W}$. An inverter IN4 is comprised of a D type MOS transistor T18 in which the source-drain path is connected at one end to the voltage $V_p$ applying terminal, and the other end of the source-drain path and the gate are connected to the output terminal, and an E type MOS transistor T19 in which the source-drain path is connected between the output terminal and the earth potential $V_S$, and the gate is connected to the output node N7 of the oscillator circuit 120. This produces a pulse signal OSC of which the output amplitude at the node N7 is amplified up to between the write voltage $V_p$ and the ground potential $V_S$. The pulse signal OSC is applied through a capacitor CP2 to the node N8. An E type MOS transistor T20 is provided of which the source-drain path is inserted between the node N8 and the write voltage $V_p$ applying terminal, and the gate is connected to the $V_p$ applying terminal. Further, a D type MOS transistor T21 is provided of which the source-drain path is inserted between the node N8 and the 5 V voltage $V_c$ applying terminal, and the gate is coupled with the read/write control signal R/$\overline{W}$. An N type MOS transistor T22 has the source-drain path connected between the node N8 and a node N9, and the gate is connected to the node N8. An additional E type MOS transistor T23 has the source-drain path connected between the node N9 for providing the boosted voltage VH and the write voltage applying terminal and the gate coupled with the voltage $V_p$. A further D type MOS transistor T24 has the source-drain path inserted between the voltage $V_c$ applying terminal and the node N9 and the gate coupled with the read/write control signal R/$\overline{W}$.

The operation of the boosting circuit shown in FIG. 6 will be described. In a read mode, the read/write control signal R/$\overline{W}$ is high in level and the MOS transistor T17 in the oscillator circuit 120 is turned on, so that the MOS transistor ROS does not oscillate. Simultaneously, the MOS transistors T21 and T24 are turned on. Then, the voltage at the nodes N8 and N9 is $V_c$ (5 V). In a write mode, when the read/write control signal R/$\overline{W}$ is low in level and the write voltage $V_p$ is 25 V, the oscillator 120 starts to oscillate, so that the inverter IN4 produces pulse signals OSC at the output terminal. Simultaneously, the MOS transistors T21 and T24 are cut off. Immediately after the oscillation of the oscillator 120, the node N8 is charged up to $V_p$-$V_{TH(T20)}$ through the MOS transistor T20. Similarly, the node N9 is charged up to $V_p$-$V_{TH(T23)}$ through the MOS transistor T23. The voltages $V_{TH(T20)}$ and $V_{TH(T23)}$ are threshold voltages of the transistors T20 and T23, respectively. After the oscillation is established, the voltage at the node N8 swings between $\{V_p$-$V_{TH(T20)}\}$ and $\{V_p$-$V_{TH(T20)}+V_p'\}$ ($V_p'$ is amplitude of the pulse signal OSC) according to the pulse signal OSC. The varying voltage is rectified by the MOS transistor T22. Accordingly, the voltage at the node N9, i.e. the boosted voltage VH is given by $$VH = \{V_p\text{-}V_{TH(T20)}\} + V_p'\text{-}V_{TH(T22)} \quad (3$$

Here, $V_{TH(T22)}$ is a threshold voltage of the MOS transistor T22. The boosted voltage VH changes according to a ratio of the stray capacitance present at the node N8 and the capacitance of the capacitor CP2. However, it may be set to the above described 30 V by properly selecting the ratio.

FIG. 7 shows an embodiment of a boosting voltage distributing circuit 107 shown in FIG. 3. In FIG. 7, D type MOS transistors T12 and T16 are connected in series between a node N2 and a boosted voltage VH applying terminal. The gates of these transistors are connected to the node N2. Further, a D type MOS transistor T15 is inserted between one end of the MOS transistor T16 and the voltage $V_c$ applying terminal. An inverter IN3 is connected between the voltage $V_c$ applying terminal and the earth potential $V_s$. The inverter IN3 is comprised of a D type MOS transistor T13 of which the source-drain path is connected between the $V_c$ applying terminal and the output terminal of the inverter, and the gate is connected to the output terminal thereof, and an E type MOS transistor T14 of which the source-drain path is inserted between the output terminal of the inverter and the earth potential $V_S$, and the gate is connected to the node N2. In a write mode, when the read/write control signal R/$\overline{W}$ is low, the boosted voltage VH is selectively applied to the gate of the MOS transistor T1.

The structure of the distributing circuit 106 shown in FIG. 3 is the same as that of the write circuit (or distributing circuit) 105. Assume that the i-th column select line is designated by $C_i$, a MOS transistor $TC_i$ connected between the i-th output terminal of the column decoder and the column select line $C_i$ is expressed by $TC_i$, and the the i-th boosting voltage distributing circuit by 106$i$ (not shown). An embodiment in which the present invention is applied to the column decoder is obtained by substituting the row decoder 20 into the column decoder 60, TR$_i$ into TC$_i$, R$_i$ into C$_i$, and 105$i$ into 106$i$.

As shown in FIG. 3, when the boosted voltage distributing circuits 105 and 106, and the boosted voltage distributing circuit 107 are provided in the memory system, in a data write mode, the voltage of the selected column selection line out of those column selection lines $C_1$ to $C_n$ is set at about 30 V. Further, the voltage at the node N1 is set at a value substantially equal to the write voltage $V_p$. Accordingly, the voltage of the selected column line may be made substantially equal to the write voltage $V_p$. In other words, according to the present embodiment of FIG. 3, 30 V which is 5 V higher than the prior one may be applied to the control gate of the memory cell, and 25 V which is about 3 V higher than the prior one may be applied to the drain. Therefore, the FIG. 3 embodiment can reduce the write time to the memory cells and decrease the power consumption in the decoders by decreasing the output current of the boosting circuit 110.

A memory system in which only the write circuit (distributing circuit) 105 is provided in the FIG. 3, but the write circuit connected to the column selection line and the write control circuit are unchanged, is within the scope of the present invention. A further memory system where the write circuit (distributing circuit) 106 and the boosted voltage distributing circuit 107 are provided, but the write circuit connected to the row lines is unchanged, is also within the scope of the present invention.

A modification of the write circuit (distributing circuit) 105 in FIG. 3 will be described referring FIG. 5. The write circuit is designated by 108$i$ where i designates the i-th row line. The write circuit 108$i$ is comprised of a D type MOS transistor T12 of which the source-drain path is inserted between the boosted voltage VH applying terminal and the node N3, and the gate is coupled with the signal from the node N3, an inverter IN3 including a D type MOS transistor T13 of which the source-drain path is inserted between the voltage $V_c$ applying terminal and the output terminal of the inverter and the gate is coupled with the output of the inverter and an E type MOS transistor T14 of which the source-drain path is connected between the output terminal of the inverter and the earth potential $V_S$ and the gate is connected to the node N3, a D type MOS transistor T15 of which the source-drain path is inserted between the voltage $V_c$ (5 V) applying terminal and the node N6 and the gate is coupled with the output from the inverter IN3, and a D type MOS transistor T16 of which the source-drain path is inserted between the node N3 and the node N6 and the gate is connected to the node N3. In the FIG. 5 circuit, VH is 30 V, and $V_c$ is 5 V. When the row line R$_i$ is not selected, the node N3 is initially low in level in both the write and read modes.

Accordingly, the output signal from the inverter IN3 is high to turn on the MOS transistor T15. If the gm of MOS transistor T15 is set much larger than that of the MOS transistor T16, the node N6 when the MOS transistor T15 is ON is equal to about $V_c$ level. Accordingly, if VH and the potential on node N6 are higher than $[V_{N3}-V_{TH(T12)}]$, the MOS transistor T12 is cut off and the boosted voltage VH applying terminal is disconnected from the node N3, i.e. the row line $R_i$. When the row line $R_i$ is selected to be high by the output from the row decoder, the output from the inverter IN3 is low to turn off the MOS transistor T15. At this time, if the boosted voltage VH is 30 V, the node N3 is charged through the MOS transistors T12 and T16, so that the boosted voltage VH is applied to the row line $R_i$. The MOS transistor T15 is desirable to be an enhancement type if above-mentioned condition is satisfied. The transistor T16 may be replaced by a simple resistive component.

Another modification of the write circuit 105 will be shown in FIG. 8. The write circuit shown in FIG. 4 or 5 (the boosted voltage VH distributing circuit 105i or 108i) is directly controlled by the signal on the row line. However, the circuit in FIG. 8 is controlled by the output $e_i$ of the row decoder corresponding to the row line $R_i$. In FIG. 8, the inverter IN5 including a D type MOS transistor T25 and an E type MOS transistor T26 is provided within the row decoder. One end of the source-drain path of the MOS transistor T25 is coupled with the write voltage $V_p$ or the voltage $V_c$ and the gate thereof is connected to the output terminal of the inverter IN5. The source-drain path of the MOS transistor T26 is connected between the output terminal of the inverter and the earth potential $V_S$, and the gate thereof is coupled with the output $e_i$ of the row decoder. The source-drain path of the MOS transistor $TR_i$ is inserted between the output terminal of the inverter IN5 and the row line $R_i$. An inverted voltage $\overline{VH}$ of the boosted voltage VH is applied to the gate of the transistor $TR_i$. The source-drain paths of D type MOS transistors T27 and T28 are inserted in series between the row line $R_i$ and the boosted voltage VH applying terminal. The gates of these transistors are connected to the row line $R_i$. The source-drain path of a D type MOS transistor T29 is connected between the write voltage $V_p$ or the voltage $V_c$ applying terminal and the junction of MOS transistors T28 and T29. The output signal $e_i$ of the row decoder 20 is applied to the gate of the transistor T29. In this way, the boosted voltage $VH_i$ is distributed into the selected line $R_i$ in a write mode. The circuit shown in FIG. 8 may be used as the write circuit shown in FIG. 3.

The boosting circuit shown in FIG. 6 is designed for obtaining the boosted voltage VH by using the write voltage $V_p$. Note, however, that the voltage for this purpose is not limited to the write voltage $V_p$.

Let us consider the embodiment of FIG. 3 with respect to the write circuit 105 for example. As described above, the boosted voltage VH from the boosting circuit 110 (FIG. 6) is selectively applied to the row line, through the write circuit (FIG. 4 or 5) selected by the row line $R_i$ of the row decoder 2. However, the write voltage $V_p$ may selectively be applied to the row line by using the write circuit connected to the row lines by using the boosted voltage output VH from the boosting circuit 110. In this case, the MOS transistor of which the drain-source path is connected between the write voltage applying $V_p$ terminal and the row line is controlled by the boosted voltage VH. Accordingly, it is apparent that the leakage current from the write voltage applying terminal $V_p$ in the write mode can be made zero compared with the case in FIG. 1. In this case, in order to decrease the output current from the boosting circuit 110, some special care must be taken. Another embodiment arranged on the basis of such an idea will be described referring to FIGS. 9 to 15.

Figure 9:
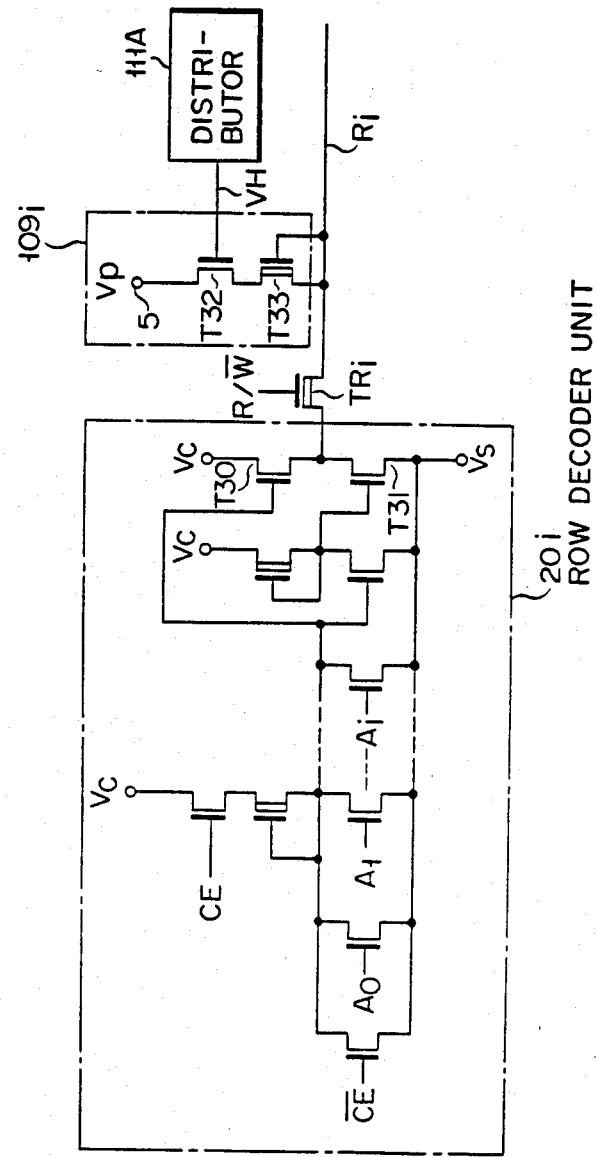
FIG. 9 is a circuit diagram of a circuit implementing the principles to control the write circuit connected to a row line of a non-volatile semiconductor memory system according to the present invention by the boosted voltage from the boosting distributing circuit.

FIG. 9 illustrates a circuitry including the decoder 20i (only the internal construction thereof corresponding to the row line $R_i$ is illustrated and will be referred to as a row decoder unit), the write circuit 109i corresponding to the row line $R_i$, and the boosted voltage distributing circuit 111A. In FIG. 9, CE and $\overline{CE}$ in the row decoder unit 20i are chip enable signal and its inverted signal, respectively, $A_o$ to $A_i$ input address signals, $V_c$ a 5 V voltage, $V_S$ a reference potential (earth potential in the present embodiment), T30 and T31 MOS transistors. The internal construction of the decoder is known and hence no explanation will be given. As in the embodiment of FIG. 3, the output from the decoder unit 20i is connected through the source-drain path of a D type MOS transistor $TR_i$ to the row line $R_i$. The MOS transistor $TR_i$ is for preventing a high voltage applied to the row line $R_i$ when data is written into the memory cell array from being applied to the decoder unit 20i. That the read/write control signal $R/\overline{W}$ is applied to it is like the embodiment shown in FIG. 3. The write circuit 109i includes an E type MOS transistor T32 and a D type MOS transistor T33. The source-drain paths of these transistors are inserted in series between the write voltage $V_p$ applying terminal and the row line $R_i$. The gate of the MOS transistor T33 is connected to the row line $R_i$, and the gate of the MOS transistor T32 is coupled with the boosted voltage VH of the boosting circuit 111. In a write mode, the boosted voltage VH is applied to the gate of the MOS transistor T32, as shown, while in a read mode, 0 V is applied thereto. The read/write control signal $R/\overline{W}$ is at 0 V in a write mode and at $V_c$ (5 V) in a read mode. When the row line $R_i$ is selected in a write mode, the row line $R_i$ is impressed with a high voltage $V_p$ through a terminal 5. At this time, the output terminal of the row decoder unit 20i is at 5 V. At this time, the gate voltage of the transistor $TR_i$ is set to 0 V and the source voltage thereof is substantially 5 V, so that the decoder unit 20i is protected by the transistor $TR_i$ even if the row line $R_i$ is applied with the write voltage $V_p$. When the row line $R_i$ is not selected, the MOS transistor $TR_i$ and the MOS transistor T31 are ON, so that the charge of the row line $R_i$ is discharged through these transistors to be 0 V.

In a read mode, the write circuit 109i is cut off. Accordingly, the leakage current from the terminal 5 is prevented. If the row line $R_i$ is selected in the read mode, $V_c$, i.e. 5 V voltage, is applied to the row line $R_i$, through the MOS transistor T30 and the MOS transistor $TR_i$ is being in an ON state. When the row line $R_i$ is not selected, the charge of the row line $R_i$ is discharged through the MOS transistors $TR_i$ and T31 to be 0 V. It is absolutely necessary to disconnect the write circuit 109i in a read mode for the purpose of preventing the current leakage from the terminal 5.

As described referring to FIG. 3, a voltage as high as possible is preferably applied to the row lines $R_1$ to $R_m$ connected to the control gates of the memory cells and the column lines $D_1$ to $D_n$ connected to the drains of the memory cells. Accordingly, in FIG. 9, some measure must be taken for boosting the voltage at the row line $R_i$ as high as possible. This can be done by supplying the boosted voltage VH to the MOS transistor T32 of the write circuit 109i from the boosting voltage distributing circuit 111A in a write mode. The boosting circuit 111 is for obtaining the boosted voltage VH by boosting the write voltage $V_p$ by making use of the capacitance coupling, and is provided in the integrated circuit of the memory system. For this reason, the current capacity is relatively low. In a recent tendency of this technical field, the transistors are more minute and the memory capacity is greatly increased. As a result, the current consumed by the decoder is also increased two or more times the conventional value. Accordigly, in order to decrease the current consumption in the memory system, it is desirable to decrease the current consumption in the decoder.

Accordingly, in another embodiment of the present invention, the boosted voltage VH is not supplied to the write circuits corresponding to the non-selected row lines or column lines, thereby to electrically disconnect the write circuits. In this way, the current consumption in the decoders due to the write voltage $V_p$ in a write mode is remarkably reduced.

Another embodiment of the present invention is so designed that the boosted voltage VH is not supplied to the write circuits 109i corresponding to non-selected lines of at least the half of the row lines or column lines in the memory cell array thereby to electrically disconnect the write circuits 109i from the row line $R_i$. With this arrangement, the current consumption of the decoder is reduced. In FIG. 9, the write circuit is provided only for the row line $R_i$. Alternatively, the write circuits may be provided for both the row and column lines.

In an embodiment shown in FIG. 10, the decoder 20 is provided with 2P decoder units as shown in FIG. 9. Of these decoder units, the units $20_1$ to $20_p$ constitute a first decoder section 20A and the units $20_{p+1}$ to $20_{2p}$ constitute a second decoder section 20B. The internal constructions of the decoder units are identical with one another, and already described in FIG. 9. Hence, no explanation of the internal construction will be given, although the internal constructions of only the decoder units $20_1$ and $20_{2p}$ are illustrated, for ease of explanation. The row lines corresponding to the decoder units $20_1$ to $20_{2p}$ are assumed to be $R_1$ to $R_{2p}$, respectively.

A boosted voltage VH1 from a first boosting voltage distributing circuit 111A is applied to the gates of the transistors T32 in the write circuits 109 of the row decoder units $20_1$ to $20_p$. A boosted voltage VH2 from a second boosted voltage distributing circuit 111B is applied to the gates of the transistors T32 in the write circuit 109 of the row decoder units $20_{p+1}$ to $20_{2p}$. Thus, a single boosting circuit 111 is provided. A boosted voltage VH from the boosting circuit 111 is applied to the first boosted voltage distributing circuit 111A and the second boosted voltage distributing circuit 111B. The most weighted bit $A_i$ of those address inputs $A_o$, $\overline{A_o}$ to $A_i$, $\overline{A_i}$ from the row decoder unit $20_1$ is applied to the first boosted voltage distributing circuit 111A. A most weighted bit $\overline{A_i}$ of those address inputs $A_o$, $\overline{A_o}$ to $A_i$, $\overline{A_i}$ from the row decoder unit $20_{2p}$ is applied to the second boosted voltage distributing circuit 111B. The first boosted voltage distributing circuit 111A is so designed as to produce a boosted voltage VH1 when the address input signal $A_i$ is "0". The second boosted voltage distributing circuit 111B is so designed as to produce a boosted voltage VH2 when the address input $\overline{A_i}$ is "0". As described above, in the present embodiment, the boosted voltage VH is selectively supplied to the given decoder section 20A or 20B by switching the voltage VH by the first and second boosted voltage distributing circuits 111A and 111B. With this arrangement, the current from the write voltage $V_p$ supplying terminal is decreased.

Since the boosting voltage distributing circuits 111A and 111B have the same constructions, the internal construction of only the first boosted voltage distributing circuit 111A will be described referring to FIG. 11. In the embodiment to follow, the boosting circuit (110 in FIG. 3) shown in FIG. 6 will be used as the boosting circuit 111. In FIG. 11, T34 to T36 are D type MOS transistors, T37 to T42 E type MOS transistors, 131 a terminal to which the write voltage $V_p$ is applied, 133 a terminal to which the reference voltage $V_S$ (the ground potential in the present embodiment), VH an input for the boosted voltage, $A_i$ an address input signal shown in FIG. 10, $R/\overline{W}$ is a read/write control signal, VH1 a boosted output from the first boosted voltage distributing circuit 111A. The MOS transistors T35 and T37 make up an inverter IN6, and the MOS transistors T36 and T38 make up an inverter IN7.

In FIG. 11, the output terminal (node N10) of inverter IN6 is connected to the gate of a MOS transistor T34 of which the drain (node N11) is connected to the sources of the MOS transistors T40 and T41 and the drain of the MOS transistor T36. The boosted voltage VH1 from the first boosted voltage distributing circuit 111A is derived from the output terminal of the inverter IN7. The address input $A_i$ is led to the gates of the MOS transistors T37 and T38 and the read/write control signal $R/\overline{W}$ is applied to the gate of the MOS transistor T42. The boosted voltage VH from the boosting circuit 111 is applied to the source of the MOS transistor T34. In a write mode, the write voltage $V_p$ is set at 25 V, for example, and the boosted output voltage VH from the boosting circuit 111 is at 30 V, for example. The read/write control signal $R/\overline{W}$ is set at "0".

The operation of the FIG. 11 circuit will be described. When the address input $A_i$ is "0", the node N10 is supplied with $V_p$ through the MOS transistor T35. Therefore, the MOS transistor T34 is turned on, and the output voltage VH from the boosting circuit 111 is directly applied to the node N11 although the voltage value is influenced by the threshold voltage of the transistor 34. In this way, the output VH1 from the first boosted voltage distributing circuit 111A is obtained through the MOS transistor T36. Conversely, when the address input $A_i$ is "1", the MOS transistor T37 is ON, so that the node N10 is at 0 V. Further, the transistor T38 is also ON and the output VH1 is 0 V. In FIG. 11, if the current capacity of the MOS transistors T36 and T40 is set at a value larger than that of the MOS transistor T36, the potential of the node N11 closer to the drain of the MOS transistor T36 is kept at $V_p - V_{th}(T37) - V_{th}(T40)$. The $V_{th}(T39)$ is a threshold voltage of the MOS transistor T39 and $V_{th}(T40)$ is the threshold voltage of the MOS transistor T40. If the potential at the node N11 is used as a reference, a voltage substantially defined by $-(V_p - V_{th}(T39) - V_{th}(T40))$ is applied to the gate of the MOS transistor T34. Accordingly, if the threshold voltage $V_{th}(T34)$ of the MOS transistor T34 satisfies $|V_{th}(T34)| < |V_p - V_{th}(T39) - V_{th}(T40)|$, the MOS transistor T34 is in a cut-off state. Accordingly, no current flows into the node N11 through the MOS transistor T34 according to the input VH. In this respect, there arises no problem even if the current feed ability of the boosting circuit 111 is low.

When the threshold voltage $V_{th}(T34)$ of the MOS transistor T34 is high and the node N10 is at $V_p$, if the $V_{th}(T34)$ of the MOS transistor T34 is positive, the input boosted voltage VH does not appear at the node N11 unchanged.

Figure 12:
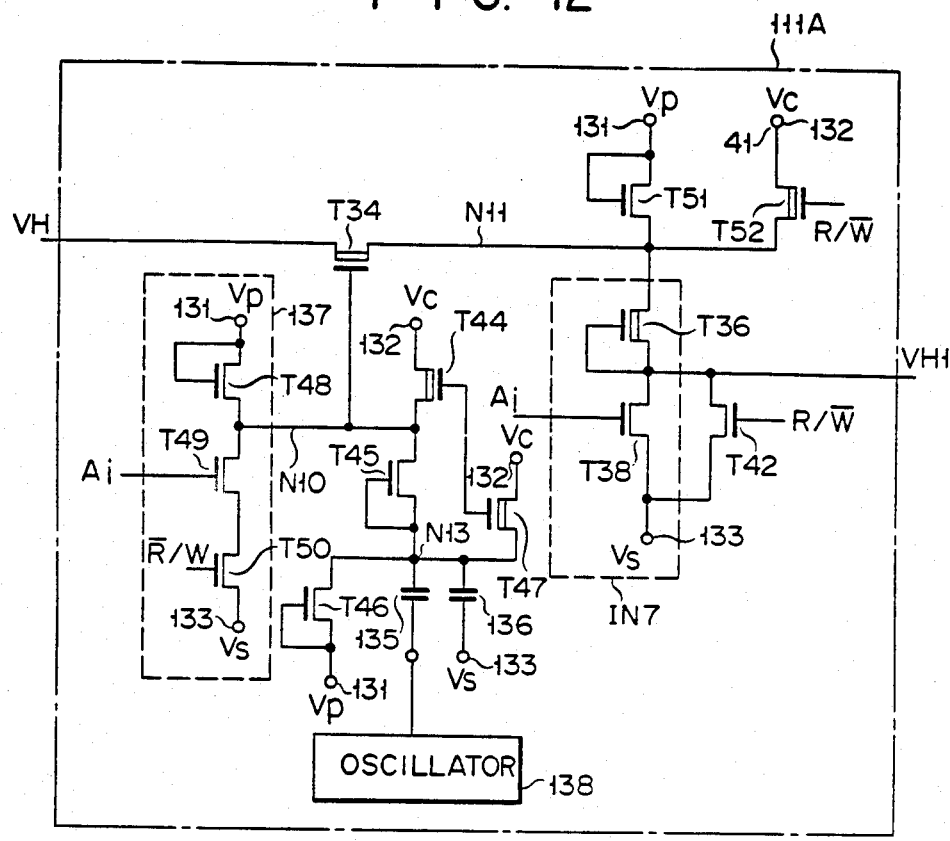
FIG. 12 is a circuit diagram of another embodiment of the boosted voltage distributing circuit shown in FIG. 10.

However, when the threshold voltage $V_{th}(T34)$ of the MOS transistor T34 is high and the node N10 is $V_p$, if the $V_{th}(T34)$ of the MOS transistor T34 is positive, the input boosted voltage VH does not appear at the node N11 unchanged. To solve this problem, all one has to do is to merely boost the voltage at the node N10. Another example of the boosted voltage distributing circuit 111A will be described referring to FIG. 12 and FIGS. 13A to 13C. In FIG. 12, a source-drain path of a D type MOS transistor T44 is connected between the node N10 and the terminal 132 of the power source $V_c$, and a read/write control signal $R/\overline{W}$ is applied to the gate of the transistor T44. The drain of an E type MOS transistor T45 is connected to a node N10 and the gate and source of the transistor T45 is connected to each other. Connected to the connection point of them are the source of the E type MOS transistor T46, one end of each capacitor 135 and 136, and the source of a D type MOS transistor T47. The drain and gate of the transistor T46 are connected to a $V_p$ power source terminal 131, and the other end of the capacitor 135 is connected to the output terminal of an oscillator circuit 138. The other end of the capacitor 136 is connected to the terminal 133 of the power source $V_S$. The drain of the transistor T47 is connected to the $V_c$ power source terminal 132. A read/write control signal $R/\overline{W}$ is applied to the gate of the transistor T47. A NAND gate 137 in place of the inverter IN6 of FIG. 11 is connected to the node N10. The NAND gate 137 includes an E type MOS transistor T48 connected to $V_p$ terminal at the drain, and E type MOS transistors T49 and T50 of which the source-drain paths are connected in series between the source of the transistor T48 and the $V_S$ power source terminal 133. An address signal $A_i$ is applied to the gate of the transistor T49, and an inversion signal $\overline{R/W}$ of a read/write control signal $R/\overline{W}$ is applied to the gate of the transistor T50. The node N10 is connected to the output terminal of the NAND gate 137.

Figure 13A:
FIGS. 13A to 13C show a set of waveforms useful in explaining the operation of the circuit of FIG. 12.
Figure 13B:
Figure 13C:
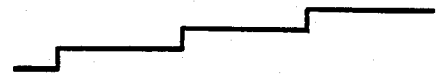

In the first boosted voltage distributing circuit shown in FIG. 12, when an oscillator circuit 138 produces a pulse signal (of which the maximum voltage is $V_p$ and the minimum voltage is about $V_S$) as shown in FIG. 13A, the potential at the source (node N13) of the MOS transistor T46 changes as shown in FIG. 13B. Accordingly, the potential at the node N10 is boosted as shown in FIG. 13B. In FIG. 13B, the $V_{th}(T46)$ is a threshold voltage of the MOS transistor T46.

Figure 14:
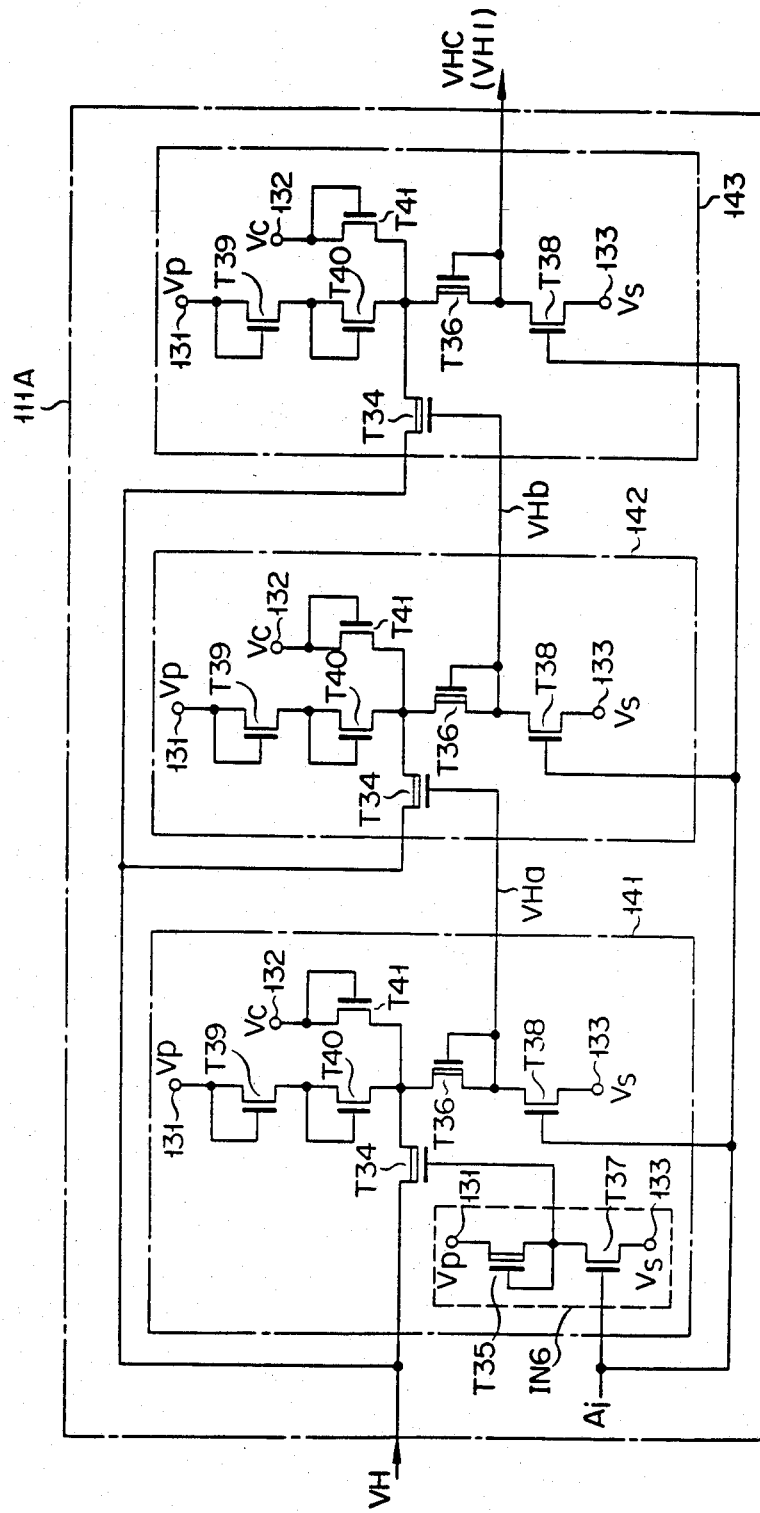
FIG. 14 is a circuit diagram of yet another embodiment of the boosted voltage distributing circuit shown in FIG. 10.

In case where the threshold voltage $V_{th}(T34)$ of the MOS transistor T34 of the boosted voltage distributing circuit 111A is high, it is possible to use the boosted voltage distributing circuit 111A shown in FIG. 14 in place of the circuit shown in FIG. 12. The boosted voltage distributing circuit 111A shown in FIG. 14 is comprised of a first stage distributing circuit 141, a second stage distributing circuit 142, and a third stage distributing circuit 143. The first stage distributing circuit 141 has the same construction as that of FIG. 11, and the second and third stage distributing circuits 142 and 143 each correspond to the first stage distributing circuit but having no inverter IN6. The output voltage VH from the boosting circuit 111 is applied to the sources of the first to third transistors T34. The address signal $A_i$ is applied to the gates of the MOS transistors T38 in the first to third distributing circuits. The output VHa of the first distributing circuit 141 is applied to the gate of the MOS transistor T34 of the second distributing circuit 142. The output VHb from the second stage distributing circuit 142 is applied to the gate of the MOS transistor T34 of the third stage distributing circuit 143. Further, the output VHC of the third distributing circuit 143 is used as the output VH1 of the first boosted voltage distributing circuit 111A.

In FIG. 14, when the input boosted voltage VH is sufficiently larger than the write voltage $V_p$, the output VHa of the first stage distributing circuit 141 is a difference when the threshold value $V_{th}(T34)$ of the MOS transistor T34 is subtracted from the voltage $V_p$. When $V_{th}(T34) < 0$, VHa is expressed by $VHa = V_p + |V_{th}(T34)|$. The output VHb of the second stage distributing circuit 142 is given by $VHb = VHa + |V_{th}(T34)|$, since the gate potential of the MOS transistor T34 is VHa. Similarly, the output $VHC = VH1$ of the third stage distributing circuit is given by $VHC = VHb + |V_{th}(T34)|$.

In the embodiment shown in FIG. 10, the output of either of the distributing circuit 111A or 111B is prohibited on the basis of the address signal $A_i$ or $\overline{A_i}$. In other words, the write circuit 109 belonging to either of the first decoder section 20A or the second decoder section 20B is electrically disconnected from the related circuit. Therefore, consumption of the decoder may be reduced.

In the FIG. 10 embodiment, the row decoder is divided into two sections 20A and 20B. The decoder sections may further be increased in number. FIG. 15 shows a case where the decoder 20 is divided into four sections 20A to 20D. The decoder section 20A corresponds to the address bits ($\overline{A_o}$, $A_1$), the decoder section 20B corresponds to the address bits ($A_o$, $\overline{A_1}$), the decoder section 20C corresponds to the address bits ($\overline{A_o}$, $\overline{A_1}$) and the decoder section 20D corresponds to the address bits ($\overline{A_o}$, $\overline{A_1}$). First to fourth distributing circuits 111A to 111D controlled by the output signals $e_1$ to $e_4$ in the decoder sections 20A to 20D are provided which are supplied with the boosted voltage VH from the boosting circuit 111. The output signals from the boosted voltage distributing circuits 111A to 111D are supplied to the write circuit 109 (FIG. 10) relating to the row lines. As shown in FIG. 15, four boosting voltage distributing circuits are provided, so that no boosted voltage may be supplied to the write circuit (109 in FIG. 10) connected to at least ¾ non-selected selected lines of those all the row lines. Accordingly, the current consumption of the decoder at the write circuit in a write mode may be reduced about ¼ that of the conventional memory system.

The circuit of each of FIGS. 10 and 15, which is arranged corresponding to only the row decoder, may be arranged corresponding to the column decoder 60. It is needless to say that the boosted voltage distributing circuits shown in FIGS. 7 and 8 may be applicable as the boosted voltage distributing circuits 111A to 111D. For example, the control, signal $e_i$ in FIG. 8 may be corresponded to the control signals $e_1$ to $e_4$ in FIG. 15.

In the embodiment shown in FIG. 3, the data stored into the memory cells $TM_{11}$ to $TM_{mn}$ often drops out. It is important to find defective memory cells of which the data may be dropped out after the memory cell array is manufactured. By convention, it takes a long time to find such defective memory cells. This may be solved by slightly modifying the row decoder 20 and the column decoder 60, and if so done, the utility of a nonvolatile semiconductor memory system according to this invention is further improved. Another embodiment of the memory device according to the present invention provided with a test means to find the defective memory cells quickly will be described referring to FIGS. 16A to 16D, 17A and 17B, 18A and 18B, and 19A and 19B.

Figure 16A:
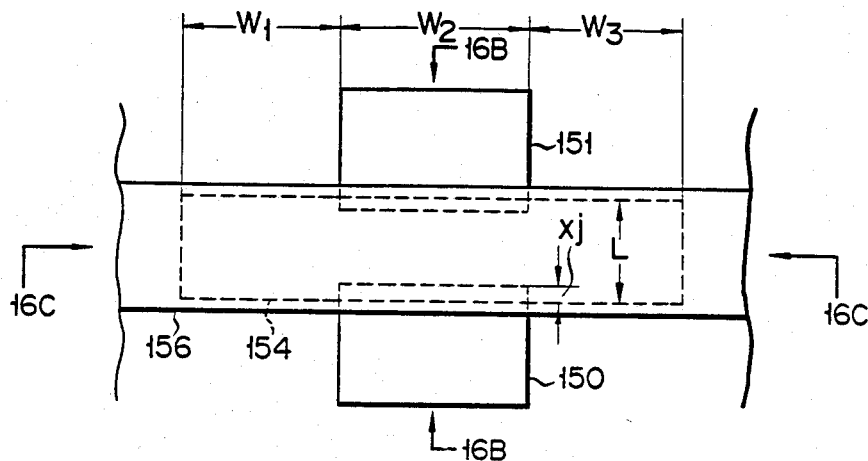
FIGS. 16A to 16C are a plan view and cross sectional views of a floating gate type MOS transistor used in the non-volatile semiconductor memory system according to the present invention.

For a better understanding of the present invention, the structure of the floating gate type MOS FET will be described referring to FIGS. 16A to 16D. FIG. 16A is a plan view of a floating gate type memory cell, FIG. 16B is a cross sectional view taken along line 16B—16B in FIG. 16A, and FIG. 16C is a cross sectional view taken along line 16C—16C in FIG. 16A.

Figure 16B:
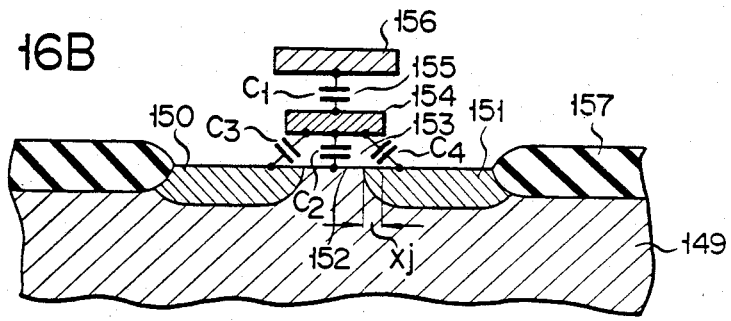
Figure 16C:
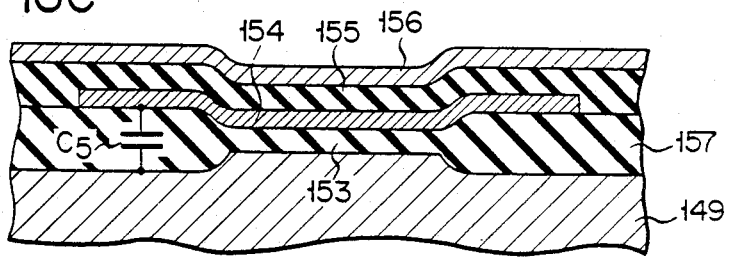
Figure 16D:
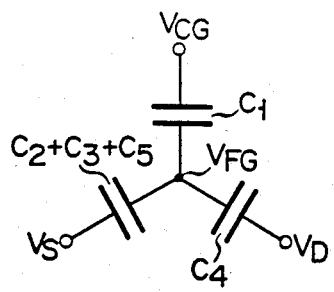
FIG. 16D is an equivalent circuit of the floating gate type MOS transistor shown in FIG. 16B with relation to capacitances present in the transistor.

As seen from FIGS. 16A to 16C, a source region 150 and a drain region 151 of an n-type conductive layer are formed in a semiconductor substrate 149. A channel region 152 is formed between the source region and the drain region. Further, a first insulating film 153, a first polycrystaline-silicon layer 154, a second insulating layer 155, and a second polycrystalline-silicon layer 156 are formed in succession over parts of the channel region 152, the source region 150 and the drain region 151. A field insulating film 157 is formed on the surface area of the substrate 149 other than the surface area having thereon the source region 150, the drain region 151 and the channel region 152. The first polycrystalline-silicon layer 154 is used as a floating gate and the second polycrystalline-silicon layer 156 is used as a control gate. For injecting electrons into the floating gate in order to write data into the memory cell, the source region 150 is set at a potential substantially equal to the ground potential, and a high voltage is applied to the control gate 156 and the drain region 151. Then, the electron-hole pairs are generated by impact ionization occurring near the drain region 151 and only the electrons of these pairs are injected into the floating gate 154, as described above. The capacitances at the respective portions in the floating gate type MOS transistor are illustrated in FIG. 16D in the form of an equivalent circuit. The equivalent circuit will be described later.

FIGS. 17A and 17B show the internal constructions of the row decoder 20 and the column decoder 60 shown in FIG. 1. It is evident that the thus constructed row column decoders 20 and 60 may be applied to the FIG. 3 embodiment of the present invention. When the address signals $A_o$, $\overline{A_o}$ to $A_i$, $\overline{A_i}$ are inputted into the row decoder 20, the conduction of the decoder transistors $AT_{11}$ to $AT_{mi}$ is controlled by these address signals. One row line is selected from the row lines $R_1$ to $R_m$ on the basis of the conduction state of the decoder transistors $AT_{11}$ to $AT_{mi}$. To be more specific, the row line of which the transistors arranged in a row direction are all nonconductive is selected. In the case of the column decoder 60, when it receives address signals $B_o$, $\overline{B_o}$ to $B_j$, $\overline{B_j}$, one column select line is selected with relation to which the column decoder transistors of those transistors $BT_{11}$ to $BT_{nj}$ connected to the column select lines $C_1$ to $C_n$ are all nonconductive. The column lines $D_1$ to $D_n$ are selected by controlling the conductions of the column gate transistors $TD_1$ to $TD_n$ corresponding to the column select lines $C_1$ to $C_n$. When one row line and one column line are selected, one memory cell is selected. The signal read out from the memory cell selected is supplied to the output circuit 50. For example, in a write mode, if the row line $R_1$ and the column line $D_1$ are selected, the write voltage $V_p$ (25 V) is applied through the transistor $WR_1$ to the row line $R_i$, and the write voltage $V_p$ is applied through the transistor $WC_1$ to the column selection line $C_1$. As a result, a high voltage of $V_p - V_{th}(T1)$ (about 20 V) is applied to the column line $D_1$, so that data is written into the memory cell $TM_{11}$. Here, the $V_{th}(T1)$ is a threshold voltage of the MOS transistor T1. The output line of the above explanation has been given referring to FIG. 1. To explain the electrical stress applied to the memory cells, the internal construction of the decoder has been employed.

In a situation where one memory cell is selected while the remaining memory cells are not selected, the non-selected memory cells are under one of the following conditions.

(1) The column line $D_1$ is selected, while the row line $R_1$ is not selected.

(2) The row line $R_1$ is selected, while the column line $D_1$ is not selected.

(3) The row line $D_1$ and the column line $R_1$ are both in non-selected state. In the situation of (1) above, the control gate of the corresponding memory cell is 0 V, while the drain is impressed with high voltage (20 V). In the situation of (2) above, the drain of the corresponding memory cell is at 0 V, but 25 V is applied to the control gate. Accordingly, in the case of (1) and (2), the data in the memory cell, i.e. the electrons in the floating gate, are adversely affected. When the floating gate type MOS transistor is used as a memory cell, an electrical field between the floating gate and the channel region is made more intensive than that between the control gate and the floating gate, thereby to improve the efficiency of the data write and to increase the $g_m$ of the memory cell in a read mode.

A variation of the potential of the floating gate 154 of the floating type memory cell shown in FIGS. 16A to 16C will be described referring to FIG. 16D. In the structure shown in FIGS. 16A to 16D, a coupling capacitor between the control gate 156 and the floating gate 154 is expressed by $C_1$; the coupling capacitances between the floating gate 154 and the channel region 152, the floating gate 154 and the source region 150, the floating gate 154 and the drain region 151, and the floating gate 154 and the substrate 149 are expressed by $C_2$, $C_3$, $C_4$ and $C_5$, respectively; the voltages of the control gate 156, the floating gate 154, and the drain 151 are $V_{CG}$, $V_{FG}$, and $V_D$; the potential of the source 150 is $V_S$; the potential of the substrate 149 and the channel region 152 are at 0 V. Then, the structure may be expressed by the equivalent circuit shown in FIG. 16D. From the equivalent equation, if it is assumed that the charge injected into the floating gate 154 is $Q_1$, the following equation holds $$C_1(V_{CG} - V_{FG}) + (C_2 + C_3 + C_5)(-V_{FG}) + C_4(V_D - V_{FG}) + Q_1 = 0$$

Accordingly, the potential $V_{FG}$ of the floating gate 154 is expressed by the following equation $$V_{FG} = \frac{Q_1}{C_1 + C_2 + C_3 + C_4 + C_5} (C_1 V_{CG} + C_4 V_D + Q_1)$$

If $\frac{1}{C_1 + C_2 + C_3 + C_4 + C_5}$ is substituted by $\Delta V_{FG}$ we have $$V_{FG} = \frac{C_1 V_{CG} + C_4 V_D}{C_1 + C_2 + C_3 + C_4 + C_5} + \Delta V_{FG} \qquad (4)$$

The mathematical expression of the equation (4) will be discussed in more detail. In the floating type MOS transistor shown in FIGS. 16A to 16C, the memory cell generally used has dimensions: $W_1 = W_2 = W_3 = 4$ μm, $L = 4$ μm, $x_j = 1$ μm. Further, the thickness $t_{ox}$ of the first insulating film 153 is 800Å, the thickness $t_{ox2}$ of the second insulating film 155 is 1,200Å, the thickness $t_{oxF}$ of the field insulating film 157 is 7,000Å. A dielectric constant of the insulating layer is $\epsilon_{ox}$. Then, the capacitances $C_1$ to $C_5$ are given by the following equations.

$$C_1 = \frac{\epsilon_{ox}(W_1 + W_2 + W_3)L}{t_{ox2}}$$

$$C_2 = \frac{\epsilon_{ox} \cdot W_2(L - 2x_j)}{t_{ox1}}$$

$$C_3 = \frac{\epsilon_{ox} \cdot W_2 \cdot x_j}{t_{ox1}}$$

$$C_4 = \frac{\epsilon_{ox} \cdot W_2 \cdot x_j}{t_{ox1}}$$

$$C_5 = \frac{\epsilon_{ox}(W_1 + W_3)L}{t_{oxF}}$$

Substituting the above five equations into the equation (3), we have the following equation (5)

$$V_{FG} = 0.6195 V_{CG} + 0.0774 V_D + \Delta V_{FG} \qquad (5)$$

An electrical field $E_1$ between the floating gate 154 and the drain 151, and an electrical field $E_2$ between the control gate 156 and the floating gate 154 are $$|E_1| = \left| \frac{V_{FG} - V_D}{t_{ox1}} \right|$$

$$|E_2| = \left| \frac{V_{CG} - V_{FG}}{t_{ox2}} \right|$$

When data is written into the selected memory cell to inject electrons into the selected one and $\Delta V_{FG}$ has $-6$ V, it is considered that the following conditions A and B hold in some non-selected memory cells: the condition A; the row line is "0" but the column line is "1" (corresponding to the above state (1)) and the condition B; the row line is "1" but the column line is "0" (corresponding to the above state (2)).

In the case of the condition A:

When $V_{CG} = 0$ V, $V_D = 20$ V, and $\Delta V_{FG} = -6$ V, the floating gate voltage $V_{FG}$ obtained by equation (5) is $-4.45$ V. Hence, the electrical fields $|E_1|$ and $|E_2|$ are $$|E_1| = \frac{-4.45 - 20}{800 \times 10^{-8}} = 3.06 \times 10^6 \text{ (V/cm)}$$

$$|E_2| = \frac{4.45}{1200 \times 10^{-8}} = 3.71 \times 10^5 \text{ (V/cm)}$$

In the case of the condition B:

When $V_{CG} = 25$ V, $V_D = 0$ V, and $\Delta V_{FG} = -6$ V, the $V_{FG}$ obtained by the equation (5) is $-9.49$ V. Hence, we have $$|E_1| = \frac{9.49}{800 \times 10^{-8}} = 1.19 \times 10^6 \text{ (V/cm)}$$

-continued $$|E_2| = \frac{25 - 9.49}{1200 \times 10^{-8}} = 1.29 \times 10^6 \text{ (V/cm)}$$

As seen from the above equations, the maximum voltage $|E_2|$ is applied to the floating gate of the memory cell under the condition A, and this memory cell is under the most severe condition in keeping the data (electrons in the floating gate). Actually, if the memory cell has a poor quality of the gate oxide film, the high electrical field causes such memory cell possibly to fail to hold the data.

Now let us calculate a time that the electrical stress in the case of the condition A is applied to the memory cell and a test time taken for finding the defective memory cell to be damaged by the electrical stress. These calculation will be conducted on the assumption that data are written into the memory cells belonging to a column line $D_1$. For writing data into all the memory cells belonging to the column line $D_1$, for example, data is first written into the memory cell $TM_{1l}$, and subsequently data is written into the succeeding memory cells $TM_{21}$, $TM_{31}$, ..., $TM_{m1}$ in a similar manner. Through this writing process, the memory cell $TM_{11}$ experiences (m-1) times of the electrical stress under condition A. Similarly, the memory cells $TM_{22}$, ..., $TM(m-1)$ experience (m-2) times, ..., one time of electrical stress, respectively. However, the memory cell $TM_{m1}$ has no experience of the electrical stress. A total time taken for the electrical stress to be applied to the memory cell $TM_{11}$ (m-1) times is $t_p(m-1)$ where $t_p$ is a time taken for one time data write operation.

For testing the data holding characteristic of each memory cell, exactly the same electrical stress must be applied to the memory cells. That is to say, the memory cells $TM_{21}$, $TM_{31}$, ..., $TM_{m1}$ must have the experience of one time, two times, ..., (m-1) times of the stress applications. To test the memory cells $TM_{11}$ to $TM_{m1}$ connected to one column line $D_1$ under the same condition, that is, to find the defective memory cell in data holding by testing the cells under the condition A, the memory cell $TM_{m1}$ having no experience of the stress application must be subjected to the electrical stress by (m−1) times for the test. For testing all the memory cells relating to the total number n of the column lines under the same condition, the write test must be conducted n×(m-1) times. In connection with one output bit of an EPROM of 64 K bits (8 K words × 8 bits), since m=256 and n=32, if the time of one-time write operation is $t_p$, the total time of the write test of all the memory cells is 32×(256−1)×0.05=408 sec.

Thus, the test needs 6 minutes and 48 seconds and this value is impractical.

The inventors of this invention have succeeded in reducing the above test time by slightly modifying the row decoder 20 and the column decoder 60 in the FIG. 3 embodiment, with the same stress applied to all the memory cells in the memory cell array. An embodiment of the decoder realizing this will be described referring to FIGS. 18A to 18B. FIG. 18A illustrates an internal circuit arrangement of the row decoder 20 shown in FIG. 3. Since the decoder units have the same construction, one unit as a typical example will be described. The output terminal $NA_1$ of the row decoder is connected through the transistor $TR_1$ to the row line $R_1$. A transistor T53 is connected between the output terminal $NA_1$ and the terminal $V_c$. A test transistor $TA_{k1}$ is connected in parallel with row decoder transistors $AT_{11}$ to $AT_{1i}$ inserted between the terminal $NA_1$ and the $V_S$ terminal. A write test signal WT for the memory cells is applied to the gate of the transistor $TA_{k1}$. This signal is high in level "1" in a test mode to find the defective memory cell, and is low "0" in a normal mode of the memory system. FIG. 18B shows an internal circuit arrangement of the column decoder of FIG. 3. Since the column decoder units have the same construction, only one typical example will be described. The output terminal $NB_1$ of the column decoder 60 is connected to the column select line $C_1$ through the transistor $TC_1$. A transistor T53 is inserted between the output terminal $NB_1$ and the $V_c$ terminal. A write test transistor $TA_{11}$ is inserted between the $V_S$ terminal and the ends the source-drain paths of transistors $BT_{11}$ to $BT_{1j}$ for the column decoder of which the other ends are connected to the output terminal $NB_1$. A write test signal $\overline{WT}$ is applied to the gate of the transistor $TA_{l1}$. The write test signal $\overline{WT}$ is "0" in logical level in a test mode of the memory system, and is "1" in a normal mode.

In the decoders constructed as shown in FIGS. 18A and 18B, in a normal read and write mode, the signal WT is "0" and the signal $\overline{WT}$ is "1". Therefore, the row and column decoders both have their outputs determined by the address signals. In a write test mode, the signal WT is "1" and the signal $\overline{WT}$ is "0". Therefore, the decoder outputs are independent of the address signals and all the outputs of the row decoder 20 are "0", that is, all the row lines are in non-selected state. On the other hand, all the outputs of the column decoder 60 are "1", that is, all the column selection lines or all the column lines are in selected state. When the row decoder shown in FIG. 1 is constructed as shown in FIG. 18A, and the column decoder 60 is constructed as shown in FIG. 18B, if in a write mode, the $V_p$ is 25 V and the input data, i.e. the node N2 is "1", all the column lines $D_1$ to $D_n$ are selected and charged up to about 20 V. As a result, the memory cells belonging to all the column lines may simultaneously be tested, and the test time under the same condition as the conventional one is $(m-1) \times t_p$. The test time of the EPROM of 64 K, for example, if $t_p$ is 50 ms, (256−1)×0.05=12.75 seconds.

Six minutes 48 seconds of the conventional test time is remarkably reduced to only 12.75 seconds.

The FIG. 19A circuit may be used for the FIG. 18A circuit and the FIG. 19B circuit may be used for the FIG. 18B circuit. The FIG. 19A circuit is an improved conventional row address buffer circuit and the FIG. 19B circuit is an improved conventional column address buffer circuit. More specifically, in the FIG. 19A circuit, transistors $T_{i1}$ to $T_{i3}$ of which the conduction is controlled by the test signal $\overline{WT}$ applied to the gates, are additionally coupled with the conventional row address buffer circuit. In the FIG. 19B circuit, transistors $T_{j1}$ to $T_{j3}$ of which the conduction is controlled by the test signal WT applied to the gate, is additionally coupled with the conventional column address buffer circuit.

The write test for the memory cells is possible by applying the row address buffer circuit shown in FIG. 19A to the row decoder 20 of the memory system of FIG. 1 and applying the column address buffer circuit shown in FIG. 19B to the column decoder 60. In a write test mode, when the test signal WT is "1" and $\overline{WT}$ is "0", all the row address signals $A_i$ to $\overline{A_i}$ are "0" and all the column address signals $B_j$ and $\overline{B_j}$ are "1". Accordingly, the outputs of the row decoder 20 are all "0" and the outputs of the column decoder are all "1". Accordingly, the effect obtained is the same as that when the FIGS. 18A and 18B are used. The decoders shown in FIGS. 18A, 18B, 19A and 19B are applicable for the embodiment of FIG. 3 or 10.

What we claim is:

1. An non-volatile semiconductor memory system comprising:
a memory cell array including non-volatile semiconductor memory cells having a gate insulation film, said memory cells each storing data therein through charges injected into said insulating film, said memory cells being arranged in a matrix fashion with a plurality of row lines and a plurality of column lines;
a row decoder for selecting said row lines;
a column decoder for selecting said column lines; and
test means coupled to said row and column decoders for rendering all said row lines into a non-selected state and for rendering a plurality of said column lines into a selected state when said memory cells connected to the plurality of said column lines are subjected to a test, wherein said test impresses a predetermined voltage to a predetermined portion of each said non-volatile memory cell connected to said column lines which are brought into said selected state.

2. A non-volatile semiconductor memory system according to claim 1, wherein said test means comprises:
a plurality of first MOS transistors each connected in parallel with a row line selection MOS transistor group of said row decoder;
a plurality of second MOS transistors each connected in series with a column line selection MOS transistor group of said column decoder; and
control means for rendering all said first MOS transistors conductive so as to set all said row lines in a non-selected state, and for rendering said second MOS transistors non-conductive so as to set said plurality of said column lines into a selected state.

3. A non-volatile semiconductor memory system according to claim 1, wherein said test means includes a plurality of first MOS transistors each connected between one end of a source-drain path of a corresponding predetermined second MOS transistor constituting an address buffer circuit of said row decoder and a reference voltage terminal, each of said first MOS transistors being rendered non-conductive only when said memory cells are under said test; and
a plurality of third MOS transistors each connected between one end end of a source-drain path of a corresponding predetermined fourth MOS transistor constituting an address buffer circuit of said column decoder and a reference voltage terminal, each of said third MOS transistors being rendered conductive only when said memory cells are under said test.

4. A non-volatile semiconductor memory system according to claim 1, wherein said test means comprises a plurality of address buffer circuits, each producing a pair of address signals with opposite logic levels, and means for causing said pair of address signals to have the same logic levels by applying predetermined test signals to said address buffer circuits.

5. A non-volatile semiconductor memory system according to claim 4, wherein said plurality of address buffer circuits include a row address buffer circuit and a column address buffer circuit, said row address buffer circuit producing a pair of row address signals having opposite logic levels and said column address buffer circuit producing a pair of column address signals having opposite logic levels; and said test means further includes means for causing said row decoder of said column decoder to have an unestablished state by making the logic levels of said pair of row address signals the same logic levels as said predetermined test signals.

6. A non-volatile semiconductor memory system according to claim 4, wherein said plurality of address buffer circuits include a row address buffer circuit and a column address buffer circuit, said row address buffer circuit producing a pair of row address signals having opposite logic levels and said column address buffer circuit producing a pair of column address signals having opposite logic levels; and said test means further includes means for causing said row decoder or said column decoder to have an established state by making the logic levels of said pair of column address signals the same as said predetermined test signals.

7. A non-volatile semiconductor memory system according to claim 1, wherein said non-volatile semiconductor memory cell is a floating gate type MOS transistor having a control gate connected to said row line, a drain connected to said column line, and a source connected to a ground potential line.

* * * * *